(12) United States Patent
Mitsuhashi

(10) Patent No.: US 7,670,885 B2
(45) Date of Patent: Mar. 2, 2010

(54) THIN-FILM SEMICONDUCTOR DEVICE AND METHOD FOR MANUFACTURING THE SAME

(75) Inventor: Katsunori Mitsuhashi, Yokohama (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 0 days.

(21) Appl. No.: 12/366,184

(22) Filed: Feb. 5, 2009

(65) Prior Publication Data

US 2009/0203177 A1 Aug. 13, 2009

(30) Foreign Application Priority Data

Feb. 8, 2008 (JP) ............... 2008-029577

(51) Int. Cl.
*H01L 21/00* (2006.01)
*H01L 21/84* (2006.01)

(52) U.S. Cl. .............. 438/149; 438/30; 438/166; 438/517; 438/527; 438/530; 438/532; 257/E51.005; 257/E29.151

(58) Field of Classification Search ............... 438/30, 438/149, 166, 517, 527, 530, 532, 975, FOR. 496, 438/FOR. 435, FOR. 445; 257/E51.005, 257/E29.151
See application file for complete search history.

(56) References Cited

U.S. PATENT DOCUMENTS 6,562,671 B2 * 5/2003 Ohnuma ................ 438/160

2001/0019127 A1 * 9/2001 Ishida ..................... 257/59
2002/0033485 A1 * 3/2002 Morosawa ............... 257/72

FOREIGN PATENT DOCUMENTS

JP 2004-363355 12/2004

OTHER PUBLICATIONS

P.G. Lecomber, et al., "Amorphous-Silicon Field-Effect Device and Possible Application", Electronics Letters, vol. 15, No. 6, Mar. 15, 1979, pp. 179-181.
Takayuki Ito et al., "10-15 nm Ultrashallow Junction Formation by Flash-Lamp Annealing", The Japan Society of Applied Physics, vol. 41, Part 1, No. 4B, Apr. 2002, pp. 2394-2398.

(Continued)

*Primary Examiner*—Michelle Estrada
(74) *Attorney, Agent, or Firm*—Oblon, Spivak, McClelland, Maier & Neustadt, L.L.P.

(57) ABSTRACT

A method of manufacturing a thin-film semiconductor device, including forming a crystallized region on a transparent insulating substrate, implanting an impurity into the crystallized region and an amorphous semiconductor layer to form a source diffusion region and a drain diffusion region in the crystallized region, subjecting the resultant structure to heat treatment, thereby not only activating the impurity implanted in the crystallized region and the amorphous semiconductor layer but also restoring crystallinity of only a portion of the amorphous semiconductor layer which is formed on the crystallized region to thereby turn the portion into a polycrystalline semiconductor layer, and subjecting the resultant surface to selective etching to thereby leave only the polycrystalline semiconductor layer and to remove the amorphous semiconductor layer formed on other regions, thereby forming, in a self-aligned manner, a stacked source diffusion layer and a stacked drain diffusion layer.

19 Claims, 12 Drawing Sheets

OTHER PUBLICATIONS

S.M. Sze, VLSI Technology, second edition, McGraw-Hill International Editions, Electrical and Electronic Engineering Series, 1988, 6 pages.

Hiroshi Kotaki et al., "Low Resistance and Thermally Stable Ti-Silicided Shallow Junction Formed by Advanced 2-Step Rapid Thermal Processing and Its Application to Deep Submicron Contact", Jpn. J. Appl. Phys., vol. 32, Part 1, No. 1B, Jan. 1993, pp. 389-395.

Hiroshi Kotaki et al., "Novel Oxygen Free Titanium Silicidation (OFS) Processing for Low Resistance and Thermally Stable Salicide (Self-Aligned Silicide) in Deep Submicron Dual Gate CMOS (Complementary Metal-Oxide Semiconductors)", Jpn. J., Appl. Phys., vol. 34, Part 1, No. 2B, Feb. 1995, pp. 776-781.

* cited by examiner

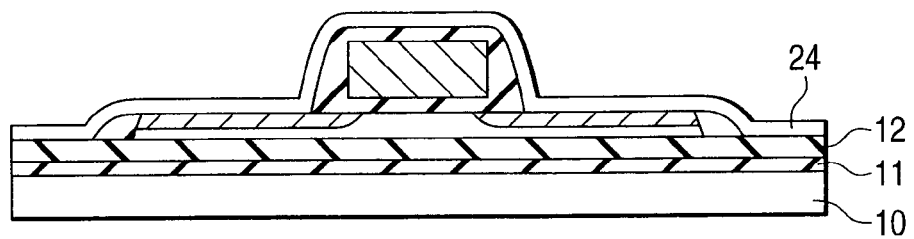
F I G. 2 A
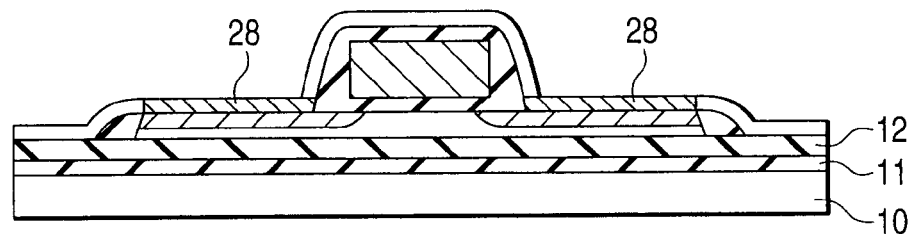
F I G. 2 B
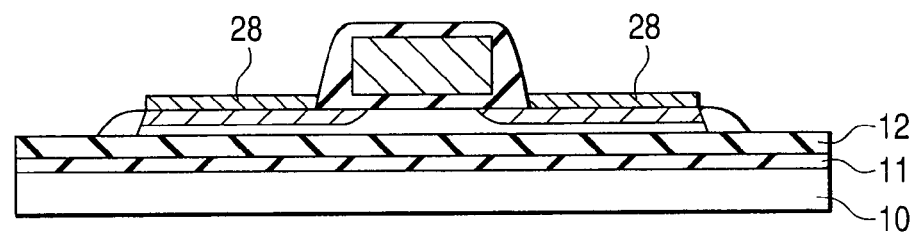
F I G. 2 C
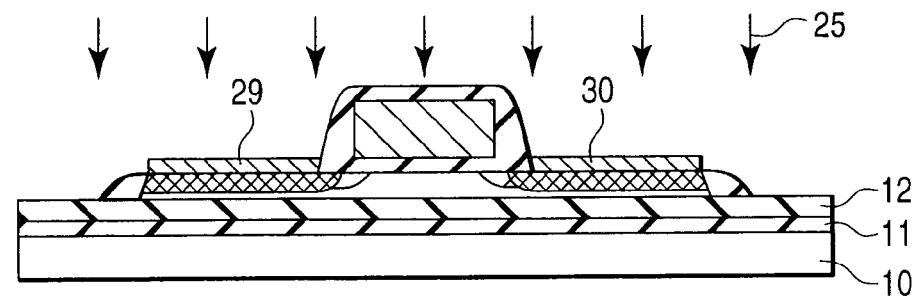
F I G. 2 D

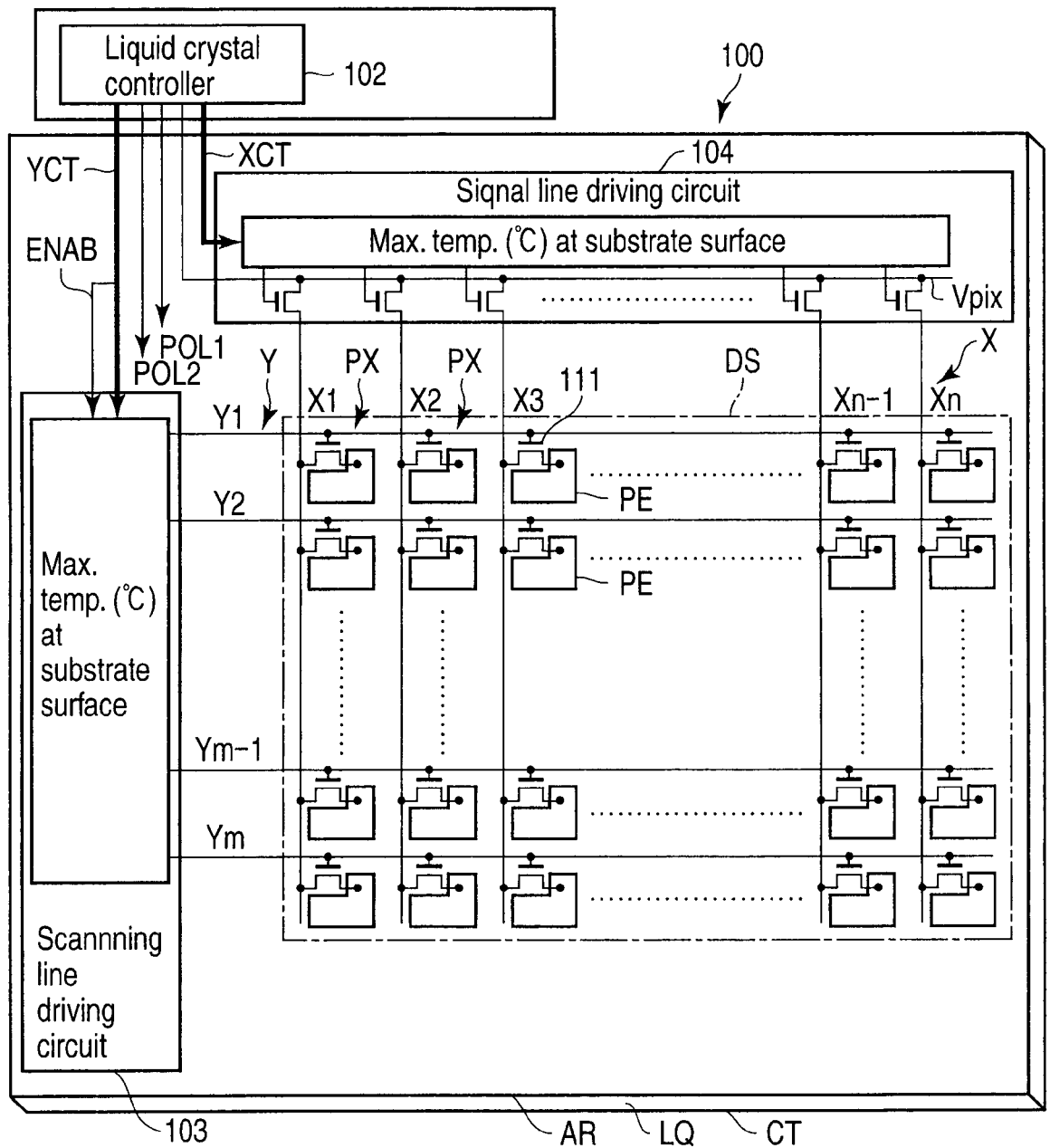
F I G. 6

THIN-FILM SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2008-029577, filed Feb. 8, 2008, the entire contents of which are incorporated herein by reference.

BACKGROUND OF THE INVENTION

1. Field of the Invention

This invention relates to a thin-film semiconductor device which is applicable, for example, to an active matrix type flat panel display and to a method for manufacturing the thin-film semiconductor device.

2. Description of the Related Art

The technique for utilizing semiconductor thin films is an important technology for forming semiconductor devices such as a thin film transistor (TFT), a contact type sensor, a photoelectric conversion device, etc. Thin film transistor is a field-effect transistor of MOS (MIS) structure and is applied to a flat panel display such as a liquid crystal display device (for example, P. G. LeComber, W. E. Spear and A. Ghaith, "Amorphous-Silicon Field-Effect Device and Possible Application", Electronics Letter, Vol. 15, No. 6, pp. 179-181, March 1979).

A liquid crystal display device is characterized in that it is generally thin in thickness, light in weight and low in power consumption, and that it is easy in displaying colors. In view of these characteristics, the liquid crystal display device is widely used as a personal computer or as a display for various kinds of mobile information terminals. When the liquid crystal display device is of active matrix type, the thin film transistor is installed therein as a pixel switching device.

The active layer (carrier mobile layer) of the thin film transistor is formed of a silicon thin film for example. This silicon thin film can be classified into amorphous silicon (a-Si) and polycrystalline silicon (non-monocrystalline silicon) having crystal phases. The polycrystalline silicon is mainly constituted by poly-silicon (Poly-Si), and microcrystal silicon (μc-Si) is also known as a kind of polycrystalline silicon. The materials for the semiconductor thin film include, other than silicon, for example SiGe, SiO, CdSe, Te, CdS, etc.

The carrier mobility of polycrystalline silicon is about 10-100 times as large as the carrier mobility of amorphous silicon. From this characteristic of polycrystalline silicon, it is evident that the polycrystalline silicon is very excellent for use as a semiconductor thin film material for a switching device.

In recent years, because of high-speed in operation, the thin film transistor wherein an active layer is formed of polycrystalline silicon is used as has been noticed as a switching device which is employed as various kinds of logic circuits such, for example, as a domino circuit and CMOS transmission gate. These logic circuits are needed as the driving circuit of a liquid crystal display device or of an electroluminescence display device, a multiplexer, EPROM, EEPROM, CCD, RAM, etc.

Herein, the conventional representative process for forming a polycrystalline silicon thin film will be explained. In this process, an insulating substrate such as a glass substrate is prepared at first and then a silicon oxide film ($SiO_2$) for example is formed as an under coat layer (or a buffer layer) on the insulating substrate. Further, an amorphous silicon (a-Si) film is formed to a thickness of about 50 nm-100 nm as a semiconductor thin film on this under coat layer. Thereafter, the amorphous silicon film is subjected to dehydrogenation treatment for decreasing the hydrogen concentration in the amorphous silicon film. Then, by means of excimer laser crystallization method, etc., the fusion/recrystallization of the amorphous silicon film is performed. More specifically, excimer laser is irradiated to the amorphous silicon film, thereby converting the amorphous silicon into polycrystalline silicon.

The thin film transistor layer formed on a glass substrate in this manner is subjected to a fine patterning technique, a thin film formation technique, an impurity doping technique, a cleaning technique, a heat treatment technique, etc. which are now employed in the field of IC (LSI). These steps are repeated to form a desired device/circuit.

At present, a semiconductor thin film of polycrystalline silicon as described above is employed as an active layer of an n-channel or p-channel type thin film transistor. In this case, the field effect mobility (the mobility of electrons or holes by the electric field effect) of the thin film transistor becomes about 100-150 $cm^2$/Vsec in the case of the n-channel type thin film transistor and about 100 $cm^2$/Vsec in the case of the p-channel type thin film transistor. By making use of the thin film transistor as described above, driving circuits such as a signal line driving circuit and a scanning line driving circuit can be formed, together with a pixel switching device, on the same substrate, thus obtaining a driving circuit-integrated display device and thereby making it possible to reduce the manufacturing cost of the display device.

As described above, by promoting the miniaturization of the thin-film semiconductor device, it has been made possible to enhance the performance of device/circuit as well as the reliability of the system. However, the thin-film semiconductor device in itself has many factors that degrade the reliability thereof. These factors include a phenomenon called "hot carrier phenomenon" originating from the physical properties of device in addition to factors originating from the materials employed therein (such as disconnection due to the fatigue or corrosion of metal interconnects, dielectric breakdown, the variation in characteristics of device due to contamination (by Na, etc.), etc.).

Namely, the electron that has been accelerated by the electric field in a channel is caused to impinge against the lattice of Si as the energy of the electron is increased beyond the energy of band gap (1.1 eV), thereby generating an electron-hole pair (impact ionization). On this occasion, the electron is attracted by the gate voltage $V_G$ and enabled to jump into the gate oxide film even if the electron is not necessarily provided with a high energy exceeding the potential barrier (about 3.1 eV) of Si—$SiO_2$. Some of the electrons are captured in this oxide film and permitted to remain therein as an electric charge. This not only causes the Vth of a transistor to shift toward the positive direction but also cause the mutual conductance gm to decrease. When the electric field inside the element is high, the electron existed in the channel is enabled to directly jump into the gate oxide film. The problem related to the reliabilities as described above is called "hot-carrier effect", presenting an important factor which obstructs the miniaturization of the device.

This hot-carrier effect is caused to generate by a high electric field. Accordingly, it is generally recognized that a method of providing an n-type (p-type) region of low dope concentration in the vicinity of the drain exhibiting a highest electric field to thereby alleviate the electric field is effective in suppressing the hot-carrier effect. A device which has been figured out to cope with this problem is a structure called "lightly doped drain (LDD)", which is also effective in the p-type region.

This LDD structure is generally produced as follows. First of all, by making use of a gate electrode as a mask, an n-type impurity ion and a p-type impurity ion are respectively implanted into a semiconductor thin film under a low doping condition {n⁻layer (p⁻-layer)}. Subsequently, an $SiO_2$ film is deposited all over the surface of the semiconductor thin film and then the entire surface of the $SiO_2$ film is uniformly etched by means of oriented dry etching, thereby leaving a sidewall spacer formed of the $SiO_2$ film on the sidewall of the gate electrode. By making use of this spacer as a mask, ions are implanted into the semiconductor thin film under the condition where the doping concentration can be made relatively high, thereby forming n⁺-layer (p⁺-layer) in the semiconductor thin film. Since the impact ionization phenomenon depends strongly on the intensity of electric field, it is possible to improve the breakdown voltage even if the alleviation in intensity of electric field is only 10%.

Meanwhile, it is generally considered necessary to perform a heat treatment of 1000° C. or more in order to activate the n-type (p-type) impurities that have been implanted into the thin film as described above so as to provide the impurities with the function of conductive carrier. However, if this heat treatment is to be applied to a glass substrate, it would be imperative to perform the heat treatment at a temperature of not higher than 600° C. in viewpoint of the heat resistance of the glass substrate. The characteristics to be obtained from the heat treatment performed under such a condition (a low temperature process) are extremely poor (deterioration of the characteristics of transistor), hence limiting the kinds of devices to which such a low temperature heat treatment can be appropriately applied. Therefore, it is now desired to develop an alternate technique which is capable of achieving sufficiently high activations even with such a low temperature process.

Incidentally, the electric characteristics of the existing thin film transistor are not so excellent that makes it possible to integrate a DA converter which is designed to convert digital picture data into analog picture signals with a signal processing circuit, such as a gate array, which is designed to process digital picture data on the same substrate of a display device. In order to realize such an integrated structure, a sufficient magnitude of current driving capability which is three to five times as high as that of the existing thin film transistor is considered to be required. Furthermore, the field effect mobility of about 300 $cm^2$/Vsec is considered to be required. In order to provide the display device with an enhanced function and an enhanced added value, it is required to further enhance the electric properties of the thin film transistor. If a static memory including a thin film transistor is to be applied to each of pixels in order to enable each pixel to have a memory function for example, the thin film transistor is required to have electric properties which are comparative to those of a single-crystal semiconductor.

Because of these reasons, there are now extensively conducted many studies on how to approach the crystallinity of the thin film semiconductor to that of single crystal as well as on important subject matters, i.e. how to repair the amorphous layer or defects that have been caused to occur due to the doping of impurities or how to enhance the crystallinity by making use of recrystallization technique and activation technique.

As described above, one of the important factors which determine the electric properties of the thin film transistor resides in how to enhance the activation factor of n-type (p-type) impurities that have been doped (ion implantation or ion doping) into a silicon thin film formed on a glass substrate. Since a fairly long time ago, this activation factor strongly depends on the temperature and time of heat treatment to be performed subsequent to the doping of impurities. It has been reported however that in the cases of the impurity implantation (doping) and heat treatment that have been employed in the conventional manufacturing process of a thin film transistor {for example, furnace annealing: 600° C./two-hour heat treatment; or quick heating by way of the convection using a high-temperature gas injection (so-called pseudo-RTA (rapid thermal annealing)): 600° C./five-minute heat treatment}, it is impossible to achieve an activation factor of even 25% (for example, T. Ito, T. Iinuma, A. Murakoshi, H. Akutsu, K. Suguro, T. Arikado, K. Okumura, M. Yoshida, T. Owada, Y. Imaoka, H. Murayama and T. Kusuda; "10-15 nm Ultrashallow Junction Formation by Flash-Lamp Annealing"; Jpn. J. Appl. Phys. Vol. 41, Part 1, No. 4B, April 2002, pp. 2394-2398).

In order to further enhance the activation factor of the impurities that have been doped, it is now considered increasingly important to enhance the quality of polycrystalline silicon, i.e. the film quality of the starting material (film quality before the heat treatment thereof) (through the improvement of recrystallization technique) and, at the same time, to find out a method for improving the crystallinity of semiconductor thin film rather than depending on the conventional method of adjusting the manner of applying the temperature and time of heat treatment based on the aforementioned concept {namely, furnace annealing: 600° C./two-hour heat treatment; or quick heating by way of the convection using a high-temperature gas injection (so-called pseudo-RTA (rapid thermal annealing)): 600° C./five-minute heat treatment}.

With respect to the method of enhancing the activation factor of impurities, there has been tried the application of RTP (Rapid Thermal Processing) {which is also called RTA (Rapid Thermal Annealing)} process, wherein RTA using a tungsten halogen lamp has been tried at first. However, due to an insufficient overlapping between the radiation spectrum of the lamp and the absorption wavelength of silicon, it was impossible to realize the effective absorption of light, resulting in the failure to achieve effective heating for temperature rise.

Recently, in the field of IC (LSI), a quick heating system using a xenon flash lamp has been studied as a light source for enabling more effective heating (for example, T. Ito, T. Iinuma, A. Murakoshi, H. Akutsu, K. Suguro, T. Arikado, K. Okumura, M. Yoshida, T. Owada, Y. Imaoka, H. Murayama and T. Kusuda; "10-15 nm Ultrashallow Junction Formation by Flash-Lamp Annealing"; Jpn. J. Appl. Phys. Vol. 41, Part 1, No. 4B, April 2002, pp. 2394-2398).

Meanwhile, as described above, the study of laser recrystallization process for converting amorphous silicon into polycrystalline silicon by making use of laser has been performed since a fairly long time ago, and, hence, the study on the laser activation using laser has been also made for a long time. However, these methods are accompanied with a problem in the application thereof to actual devices that, due to the influence of an underlying pattern or due to the influence of gate electrode, it is difficult to carry out uniform heating, thereby making these methods unsuitable for practical use.

Further, in the case of the miniaturized devices beginning from a submicron TFT, increased thinning of a Si active layer as well as increased miniaturization of contact size is assumed to be required. In the case of the conventional source/drain layers, they are formed by the heat treatment of a Si layer which has been doped in advance with impurities, wherein the impurities are activated at a temperature of 600° C. In the trial experiments using an SOI substrate, it has been found possible to realize a sheet resistance of 130 Ω/□ with $n^+$ and 522 Ω/□ with $p^+$. However, when the heat treatment is performed at a lower temperature, the activation factor of impurities would be inevitably deteriorated, unavoidably resulting in an increased electric resistance. In the case of a TFT of 0.5 μm rule, it has been estimated, from the results of the trial experiments performed on a transistor of the same size as that of the TFT according to the semiconductor manufacturing process of the prior art, that the sheet resistance of source/drain layers is required to be not higher than 100 Ω/□ and the contact resistance is required to be not higher than $1×10^{-6}$ Ωcm². Therefore, in order to realize these targets, it is indispensable to introduce a new technique for realizing these targets.

With respect to the technique for realizing low resistance source/drain layers, it is conceivable to apply a siliciding technique which has been actually employed in the field of semiconductor (IC, LSI). In the experiments conducted by the present inventors, the formation of $Ti_xSi_y$ and $Ni_xSi_y$ on an insulating substrate was tried and the performances obtained therefrom were confirmed.

On the other hand, in the case of a micro-device which is capable of achieving a high-speed operation at a low voltage, it is indispensable to increasingly lower the contact resistance. Generally, in order to lower the contact resistance as well as the electric resistance of source/drain regions, they are coped with a high-temperature heat treatment at an applicable upper limit while taking into consideration the combinations among the materials in each step.

In the process for forming a TFT on a glass substrate, the activation of the doped impurities is generally executed by way of a low temperature process of 600° C. in view of overcoming the problem of the heat resistance of glass. Further, since the material constituting the source/drain layers is Si, it is required to develop novel materials, construction and forming method so as to cope with the further lowering of electric resistance. Especially, supposing that high-frequency elements for communication are to be integrally mounted, it would be imperative to further lower the electric resistance of interconnects together with the lowering of the contact resistance.

In the IC manufacturing process, it is possible to apply a high-temperature process of 600° C. or more, so that a method of forming a low resistance thin film such as a high-melting point metal film or a high-melting point silicide film on the source/drain diffusion regions is already employed in some kinds of device. This process is called "salicide process" (SALICIDE: Self-Aligned Silicide) which is a process wherein silicide film is formed on the source/drain diffusion regions in a self-aligned manner (for example, S. M. Sze, VLSI Technology, second edition, McGROW-HILL INTERNATIONAL EDITIONS, 1988 p. 479-483).

When Ti is employed as a high-melting point metal material in the salicide-forming process, the heat treatment ($2^{nd}$ RTA) of not lower than 850° C. is required to be performed after the formation of metastable silicide ($Ti_5Si_3$ or $TiSi_2$ (C49 phase)) at low temperatures ($1^{st}$ RTA) in order to form a normally stable silicide ($TiSi_2$ (C54 phase)) layer (see for example, H. Kotaki, K. Mitsuhashi, J. Takagi, Y. Akagi and M. Koba; "Low Resistance and Thermally Stable Ti-Silicided Shallow Junction Formed by Advanced 2-Step Rapid Thermal Processing and Its Application to Deep Submicron Contact"; Jpn. J. Appl. Phys., Vol. 32, Part 1, No. 1B, January 1993, pp. 389-395). Further, in order to re-distribute the impurities doped in the Si thin film in a process of forming silicide on the Si thin film, it is generally required to carefully perform the silicide-forming process. In view of these embodiments, it is very important to carefully select a material which is well matched with the TFT-forming process from metallic materials and also carefully construct the TFT-forming process, since the performance of the end-device will be determined by these factors. Furthermore, in order to form excellent silicide, impurity oxygen existing in the gas to be used or inside the high-melting point metal should be thoroughly eliminated. Judging from the free energy in the production of oxide, most of the materials, excluding Ti and Zr, are smaller in free energy in the production of oxides thereof than that of Si, so that $SiO_2$ is caused to be formed at the crystal interfaces during the heat treatment and hence various troubles such as conduction failures are expected to be generated. As described above, under the limited condition in temperature of 600° C., experimental data obtained therefrom are still insufficient, so that it is required to establish a novel process design by fundamentally re-examining the silicide-forming process (see for example, H. Kotaki, M. Nakano, S. Hayashida, S. Kakimoto, K. Mitsuhashi, and J. Takagi; "Novel Oxygen Free Titanium Silicidation (OFS) Processing for Low Resistance and Thermally Stable SALICIDE (Self-Aligned Silicide) in Deep Submicron Dual Gate CMOS (Complementary Metal-Oxide Semiconductors)"; Jpn. J. Appl. Phys., Vol. 34, Part 1, No. 2B, February 1995, pp. 776-781).

For example, in order to provide a flat panel display device with an enhanced function and an enhanced added value, it is required to enhance the crystallinity of the semiconductor thin film to be used as an active layer in a thin film transistor and to restore the original crystallinity that has been once turned into amorphous body due to the ion implantation (or ion doping) to thereby enhance the activation factor of the impurities implanted into the active layer. It is generally required for these purposes to increase the heat treatment temperature of the substrate and to take a sufficient heat treatment time.

However, in view of the aforementioned low heat resistance of the glass substrate (in other words, in view of the problem of the heat treatment characteristics of the existing glass substrate, especially the heat shrinkage thereof which may exceed an acceptable value of the alignment margin in the step of photolithography due to the increased fineness of pattern in recent years), it is difficult to apply a process of heat treatment of 600° C. or more to the manufacturing process of a high-performance thin film transistor. In addition to this problem as well as in order to enable a low cost substrate to be utilized, it is now demanded a novel process which makes it possible to further lower the heat treatment temperature.

Incidentally, at present, there is generally employed heat resistant glass (high strain-resisting glass) such as Corning 1737 or Asahi AN-100. Otherwise, a glass substrate is subjected to annealing to enhance the heat resistance of the glass substrate before use. Both of these measures lead to an increase in cost of manufacturing process.

Further, with regard to the heat treatment time, if the heat treatment is performed at low temperatures, the heat treatment time needed for the activation of impurities will be prolonged, thus making it unpractical in overcoming the aforementioned problem. Additionally, due to the recent trend to adopt a large size substrate, it is now increasingly difficult to employ a batch treatment (a system for reducing the heat treatment time per sheet of substrate by performing the heat treatment of a plurality of substrates at the same time). Namely, in the recent trend to employ single wafer processing and in viewpoints of manufacturing tact and apparatus cost in the single wafer processing, it is becoming increasingly difficult to cope with the aforementioned problems by making use of the conventional method. Additionally, in order to realize a highly refined image display, it is now indispensable to further increase the speed of image signals, i.e. to further decrease the electric resistance of the signal lines including the source/drain regions and the contact portion.

Further, in order to enhance the miniaturization of device, it is required to form a shallow impurity diffusion region and, at the same time, to reduce the parasitic resistance at the source/drain regions, which may be caused to increase as trade-off. For the purpose of reducing the parasitic resistance, it is desirable to form an impurity distribution having a high impurity concentration region at the surfaces thereof and a sharp inclination in impurity concentration at both vertical and lateral directions. In the field of developing the TFT technique, the thinning of layer in vertical direction, especially the thinning of the Si active layer has been advanced more increasingly than the trend of developing the LSI technique, so that it is difficult to realize the 0.5 µm rule TFT simply by making use of the technique that has been adopted in the 0.5 µm rule LSI technique.

Up to date, the formation of a shallow junction has been realized by the ion implantation of low acceleration and by the lowered process temperature. However, these countermeasures for forming the shallow junction are accompanied with persistent problems including the junction leakage due to the crystal defects that have been introduced by the ion implantation, and non-uniform growth of silicide film or junction breakdown especially when the aforementioned SALICIDE process is employed.

BRIEF SUMMARY OF THE INVENTION

The present invention has been accomplished in view of the aforementioned circumstances and therefore an object of the present invention is to provide a thin-film semiconductor device having a source/drain structure which makes it possible to form excellent impurity diffusion regions while using impurity dopants and applying the heat treatment system of the impurity dopants that have been conventionally employed.

Another object of the present invention is to provide a method of manufacturing a thin-film semiconductor device having excellent characteristics, which makes it possible to form an excellent silicide/silicon interface, to form low resistance source/drain regions and a low resistance contact, and to form a sharp impurity distribution.

In order to overcome the aforementioned problems, there is provided, according to a first aspect of the present invention, a thin-film semiconductor device comprising: an island semiconductor layer formed on a transparent insulating substrate and including a source region containing a first conductivity type impurity and a drain region containing a first conductivity type impurity and spaced apart from the source region; a gate insulating film formed at least on a portion of the island semiconductor layer which is located between the source region and the drain region; a gate electrode formed on the gate insulating film, which has a sidewall spacer formed of an insulating film on a side wall thereof; a stacked source polycrystalline semiconductor layer containing the first conductivity type impurity and formed on the source region by way of solid phase growth at a temperature of not higher than 600° C.; and a stacked drain polycrystalline semiconductor layer containing the first conductivity type impurity and formed on the drain region by way of solid phase growth at a temperature of not higher than 600° C.

According to a second aspect of the present invention, there is provided a thin-film semiconductor device comprising: an island semiconductor layer formed on a transparent insulating substrate and including a source region containing a first conductivity type impurity and a drain region containing a first conductivity type impurity and spaced apart from the source region; a gate insulating film formed at least on a portion of the island semiconductor layer which is located between the source region and the drain region; a gate electrode formed on the gate insulating film, which has a sidewall spacer formed of an insulating film on a side wall thereof; a stacked source polycrystalline semiconductor layer containing the first conductivity type impurity and formed on the source region by way of solid phase growth at a temperature of not higher than 600° C.; a stacked drain polycrystalline semiconductor layer containing the first conductivity type impurity and formed on the drain region by way of solid phase growth at a temperature of not higher than 600° C.; and a thin film formed of a compound of the semiconductor and a high-melting point metal and formed on the stacked source polycrystalline semiconductor layer and on the stacked drain polycrystalline semiconductor layer.

According to a third aspect of the present invention, there is provided a method of manufacturing a thin-film semiconductor device, which comprises: forming an amorphous semiconductor layer on a transparent insulating substrate; forming a crystallized region in the amorphous semiconductor layer; forming a gate insulating film and a gate electrode on the crystallized region; implanting an impurity at low concentration into an expected source region and an expected drain region of the crystallized region respectively neighboring to opposite sides of the gate electrode, the implanting being performed using the gate electrode as a mask; forming an insulating film on a surface of the resultant structure; etching back the insulating film until the crystallized region is exposed to thereby form a sidewall spacer on a sidewall of the gate electrode; forming an amorphous semiconductor layer for forming a stacked source layer and a stacked drain layer on a surface of the resultant structure; implanting an impurity at high concentration into the crystallized region and the amorphous semiconductor layer with the gate electrode and the sidewall spacer being used as a mask to thereby form a source diffusion region and a drain diffusion region in the crystallized region;

subjecting the amorphous semiconductor layer to heat treatment, thereby not only activating the impurity implanted in the crystallized region and the amorphous semiconductor layer but also restoring crystallinity of only a portion of the amorphous semiconductor layer which is formed on the crystallized region to thereby turn the portion into a polycrystalline semiconductor layer; and subjecting the resultant surface to selective etching to thereby leave only the polycrystalline semiconductor layer which is deposited on the crystallized region and to remove the amorphous semiconductor layer formed on other regions, thereby forming, in a self-aligned manner, a stacked source diffusion layer consisting of polycrystalline semiconductor on the source diffusion layer and a stacked drain diffusion layer consisting of polycrystalline semiconductor on the drain diffusion layer.

In this method of manufacturing a thin-film semiconductor device according to the third aspect of the present invention, there may be interposed a step of pre-amorphizing a surface layer of the crystallized region by implanting Si or Ge into the crystallized region prior to the step of implanting an impurity at low concentration into an expected source region and an expected drain region, which are located in the crystallized regions respectively neighboring to the opposite sides of the gate electrode.

According to a fourth aspect of the present invention, there is provided a method of manufacturing a thin-film semiconductor device, which comprises: forming an amorphous semiconductor layer on a transparent insulating substrate; forming a crystallized region in the amorphous semiconductor layer; forming a gate insulating film and a gate electrode on the crystallized region; implanting an impurity at low concentration into an expected source region and an expected drain region of the crystallized region respectively neighboring to opposite sides of the gate electrode, the implanting being performed using the gate electrode as a mask; forming an insulating film on a surface of the resultant structure; etching back the insulating film until the crystallized region is exposed to thereby form a sidewall spacer on a sidewall of the gate electrode; forming an amorphous semiconductor layer for forming a stacked source layer and a stacked drain layer on a surface of the resultant structure; subjecting the amorphous semiconductor layer to a first heat treatment, thereby restoring crystallinity of only a portion of the amorphous semiconductor layer which is formed on the crystallized region to thereby turn the portion into a polycrystalline semiconductor layer; subjecting the resultant surface to selective etching to thereby leave only the polycrystalline semiconductor layer which is formed on the crystallized region and to remove the amorphous semiconductor layer deposited on other regions; implanting an impurity at high concentration into the crystallized region and the polycrystalline semiconductor layer with the gate electrode and the sidewall spacer being used as a mask to thereby form a source diffusion region and a drain diffusion region in the crystallized region and in the polycrystalline semiconductor layer; and subjecting the crystallized region and the polycrystalline semiconductor layer to a second heat treatment to thereby activate impurity implanted into the crystallized region and the polycrystalline semiconductor layer.

This method of manufacturing a thin-film semiconductor device according to the fourth aspect of the present invention, further comprises pre-amorphizing a surface layer of the crystallized region by implanting Si or Ge into the polycrystalline semiconductor layer which is left on the crystallized region through the selective etching prior to implanting an impurity at high concentration into the crystallized regions and the polycrystalline semiconductor layer.

According to a fifth aspect of the present invention, there is provided a method of manufacturing a thin-film semiconductor device, which comprises: forming an amorphous semiconductor layer on a transparent insulating substrate; forming a crystallized region in the amorphous semiconductor layer; forming a gate insulating film and a gate electrode on the crystallized region; implanting an impurity at low concentration into an expected source region and an expected drain region of the crystallized regions respectively neighboring to opposite sides of the gate electrode, the implanting being performed using the gate electrode as a mask; forming an insulating film on a surface of the resultant structure; etching back the insulating film until the crystallized region is exposed to thereby form a sidewall spacer on a sidewall of the gate electrode; forming an amorphous semiconductor layer for forming a stacked source layer and a stacked drain layer on a surface of the resultant structure; implanting an impurity at high concentration into the crystallized region and the amorphous semiconductor layer with the gate electrode and the sidewall spacer being used as a mask to thereby form a source diffusion region and a drain diffusion region in the crystallized region; subjecting the amorphous semiconductor layer to a first heat treatment, thereby not only activating impurity implanted in the crystallized region and the amorphous semiconductor layer but also restoring the crystallinity of only a portion of the amorphous semiconductor layer which is formed on the crystallized region to thereby turn the portion into a polycrystalline semiconductor layer; subjecting the resultant surface to selective etching to thereby leave only the polycrystalline semiconductor layer which is formed on the crystallized region and to remove the amorphous semiconductor layer formed on other regions, thereby forming, in a self-aligned manner, a stacked source diffusion layer formed of polycrystalline semiconductor on the source diffusion layer and a stacked drain diffusion layer formed of polycrystalline semiconductor on the drain diffusion layer; forming a high-melting point metal layer on a surface of resultant structure; subjecting a resultant surface to a second heat treatment to thereby form a silicide film at an interface between the stacked source diffusion layer and the high-melting point metal layer and at an interface between the stacked drain diffusion layer and the high-melting point metal layer; removing unreacted high-melting point metal layer, leaving the silicide film on the stacked drain diffusion layer and on the stacked drain diffusion layer; and subjecting a resultant surface to a third heat treatment to thereby accomplish the silicidation and form a source diffusion region including the source diffusion region, the stacked source diffusion layer and the silicide film, and a drain diffusion region including the drain diffusion region, the stacked source diffusion layer and the silicide film on opposite sides of the gate electrode.

This method of manufacturing a thin-film semiconductor device according to the fifth aspect of the present invention, further comprises pre-amorphizing a surface layer of the crystallized region by implanting Si or Ge into the crystallized region prior to implanting an impurity at low concentration into an expected source region and an expected drain region of the crystallized regions respectively neighboring to the opposite sides of the gate electrode.

Further, implanting an impurity at high concentration may be executed subsequent to the step of applying the first heat treatment. Alternatively, implanting an impurity at high concentration may be executed subsequent to applying the second heat treatment.

In this case, a second pre-amorphizing for amorphizing a surface layer of the polycrystalline semiconductor layer by the implantation of Si or Ge into the polycrystalline semiconductor layer which is left in the crystallized region due to the selective etching may be further included prior to these impurity-implantations.

In the method of manufacturing a thin-film semiconductor device according to any of the third to fifth aspects of the present invention, forming a crystallized region in the amorphous semiconductor layer may be performed by the irradiation of laser beam to the amorphous semiconductor layer, thereby fusing and solidifying the amorphous semiconductor layer.

Further, the first, second and third heat treatments may be performed by a method selected from the group consisting of furnace annealing, rapid thermal annealing, flash lamp annealing and laser annealing.

Forming a sidewall spacer on the sidewall of the gate electrode by etching back the insulating film until the crystallized region is exposed may be performed by making use of a high-density plasma etching apparatus.

In the method of manufacturing a thin-film semiconductor device according to the fifth aspect of the present invention, the high-melting point metal may be one kind of metal selected from the group consisting of Ni, Ti, Co, Mo and W.

According to a sixth aspect of the present invention, there is provided a thin-film semiconductor device which is characterized in that it is manufactured according to any of the aforementioned methods.

According to a seventh aspect of the present invention, there is provided a display device which is characterized in that it is provided with the aforementioned thin-film semiconductor device.

According to the first, the third and the fourth aspects of the present invention, since the source/drain diffusion regions are respectively constructed to have a stacked structure, it is possible to practically increase the thickness of the impurity diffusion regions, thereby making it possible to provide a thin-film semiconductor device having source/drain diffusion regions excellent in activating efficiency and minimal in parasitic resistance.

Further, according to the second and the fifth aspects of the present invention, since the source/drain diffusion regions are lined with a silicide layer, it is now possible to form source/drain diffusion regions having a low electric resistance and a contact portion having a low electric resistance. Furthermore, it is now possible to provide a thin-film semiconductor device which makes it possible to form source/drain diffusion regions excellent in junction characteristics and to enlarge the process margin, thus exhibiting excellent device characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 2A-2D are cross-sectional views each illustrating the manufacturing steps of a polysilicon thin film transistor according to Example 2;

FIG. 6 is a diagram schematically illustrating the circuit structure of an active matrix type liquid crystal display device wherein the thin film transistors obtained from the processes shown in FIGS. 1A-5D were employed;

DETAILED DESCRIPTION OF THE INVENTION

Figure 1A:
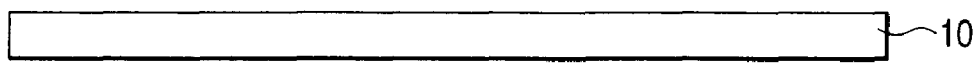
FIGS. 1A-1U are cross-sectional views each illustrating the manufacturing steps of a polysilicon (polycrystalline silicon) thin film transistor according to Example 1.

There will now be described specific embodiments of the present invention.

In the first embodiment of the present invention, in order to overcome the problems such as the deterioration of the activating factor of dopant that may be caused to generate due to the shallow junction of the source/drain regions of miniaturized device or the secondary defects that may be caused to generate due to the implantation of ions, the impurity diffusion region is practically increased in thickness by making the source/drain diffusion regions into a stacked structure, thereby solving the aforementioned problems.

More specifically, while leaving the thickness of the channel region as it is, only the source/drain diffusion regions are practically increased in thickness, thereby making it possible to enhance the impurity-activating efficiency and to enhance the process margin, thus overcoming the problems of the prior art such as generation of parasitic resistance due to a shallow junction, and junction leakage.

Further, according to the second embodiment of the present invention, a silicide layer is formed on the polycrystalline Si layer that has been stacked up at the source/drain diffusion regions, thereby lowering the electric resistance of the source/drain regions, thus securing the enhancement of the performance and, at the same time, securing the advantages of the first aspect of the present invention.

Next, the first and second embodiments of the present invention will be explained with reference to five representative examples thereof.

In the manufacturing method of the thin-film semiconductor devices as described in Examples 1 and 2 according to the first embodiment of the present invention, an amorphous Si film for forming the source/drain diffusion regions of stacked structure is formed on the predetermined source/drain-forming regions and then an impurity is implanted at high concentration and heat-treated, thereby practically increasing the thickness of only the source/drain regions while leaving the channel region as it is, thus making it possible to provide a TFT structure having source/drain regions which are high in impurity activation factor and excellent in junction characteristics.

In the manufacturing method of the thin-film semiconductor devices as described in Examples 3-5 according to the second embodiment of the present invention, a silicide layer is formed on the stacked polycrystalline Si layer, thereby making it possible to provide a TFT structure having source/drain regions which are decreased in electric resistance and, at the same time, exhibiting aforementioned excellent characteristics.

According to the process of the prior art, since the implantation of an impurity for forming source/drain diffusion regions and the subsequent heat treatment for the activation of impurity and siliciding are performed directly to an activated Si layer, it has been found increasingly difficult to control the formation of shallow junction and also to control the siliciding reaction due to the increased fineness of device and the increased thinning of the activated Si layer. As a result, it is impossible to form source/drain diffusion regions of low electric resistance, thus making it difficult to manufacture a TFT exhibiting excellent characteristics.

Whereas, in the first embodiment of the present invention, since the polycrystalline Si layer which is stacked on an activated Si layer is utilized as source/drain layers, it is now possible to control the formation of shallow junction.

Further, in the second embodiment of the present invention, since the siliciding reaction of a thick Si layer can be easily controlled in the silicide layer lining process, it is now possible to form an excellent silicide/silicon interface, thereby making it possible to form source/drain regions excellent in junction characteristics.

In the siliciding reaction, silicide of metastable state can be formed in the first heat treatment and this metastable silicide can be converted into silicide of stable phase by the second heat treatment. In this case, however, when a surface portion of the silicon region is amorphized due to a step of ion implantation such as the implantation of a dopant or Si, the siliciding reaction by means of heat treatment can be performed at a further lower temperature.

When RTA is employed as a method of heat treatment in the formation of silicide, the first heat treatment should preferably be performed at a temperature of 350-450° C. and the second heat treatment should preferably be performed at a temperature of 400-500° C. Namely, the temperature of the first heat treatment should preferably be lower than the temperature of the second heat treatment.

When the flash lamp annealing or the laser annealing is employed, the temperature of surface region of the irradiated layer may become higher than 1,000° C. However, since this is a thermal nonequilibrium process of the order of milli ($10^{-3}$) seconds or micro ($10^{-6}$) seconds, the annealing can be performed with the temperature of substrate being kept at nearly room temperature.

Incidentally, when the impurity for forming source/drain diffusion regions is implanted after the first heat treatment, the activation of the impurity will be concurrently performed in the second heat treatment.

As a result of these heat treatments, it is possible to form an excellent silicide/silicon interface, to form low resistant source/drain regions and contact, and to form a sharp impurity distribution, thus making it possible to obtain a thin-film semiconductor device exhibiting excellent characteristics.

With respect to the film thickness of the high-melting point metal film, it should preferably be confined to 20 nm-100 nm or so.

The heat treatment can be performed by a method selected from the group consisting of furnace annealing, rapid thermal annealing, flash lamp annealing and laser annealing.

The furnace annealing is one system of heat treatment wherein a plurality of substrates are mounted on a jig made of quartz or SiC and placed in a furnace heated up to high temperatures to heat the substrates by way of radiant/convective heat which is supplied from the heaters installed around the substrates.

With respect to the lamp annealing, it employs a lamp as a heating source, but there are existed various systems including a system wherein a specimen is heated by a converged optical energy to be obtained from a combination of optical systems, a system wherein the light from a lamp is directly irradiated to a specimen, a system wherein heating energy is continuously irradiated to a specimen, a system wherein very high energy is instantaneously irradiated to a specimen, etc. In a case where radiation energy is to be utilized for the heating, it is influenced by the characteristics including the radiation spectrum and the absorption wavelength of the object to be heated, so that a specimen is heated by composite effects constituted by direct heating, convective heating or indirect heating where the heating is effected through a medium, and conductive heating. The insulating film is generally permeable to the wavelength of energy beam to be used for heating a semiconductor thin film, so that the insulating film cannot be directly heated by the energy beam but is somewhat heated by the heat conduction from the heated semiconductor thin film.

Next, the manufacturing process of a polysilicon thin film transistor (TFT) according to various examples of the first and second embodiments of the present invention will be explained with reference to the accompanied drawings. This polysilicon TFT can be used for constructing a display apparatus, more specifically, for constructing the pixel switching device array, driving circuit and DA converter of an active matrix type liquid crystal display apparatus.

EXAMPLE 1

Figure 1B:
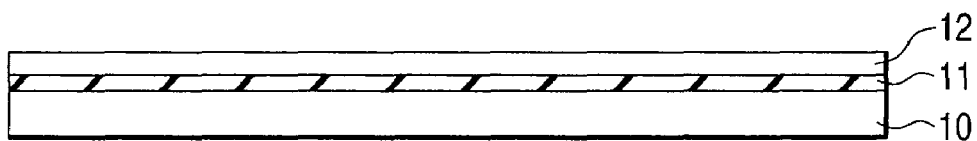
Figure 1C:
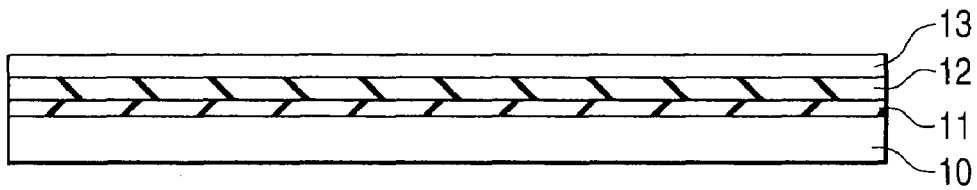
Figure 1D:
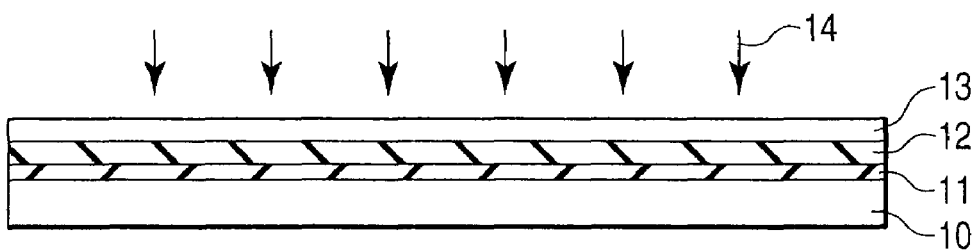
Figure 1E:
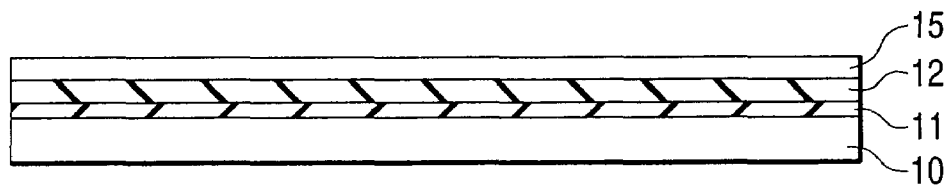
Figure 1F:
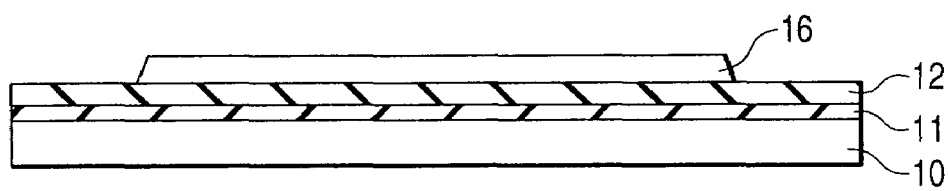
Figure 1G:
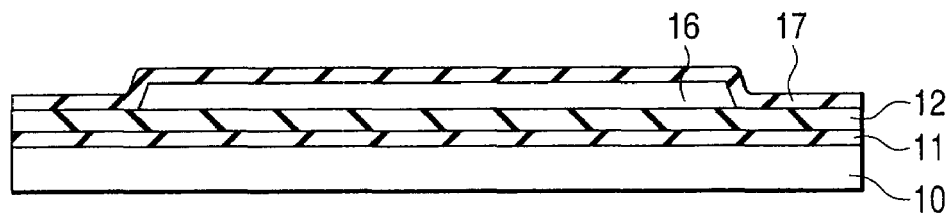
Figure 1H:
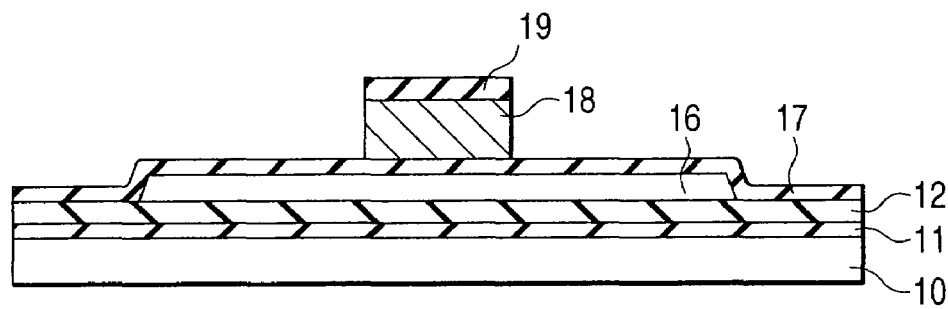
Figure 1I:
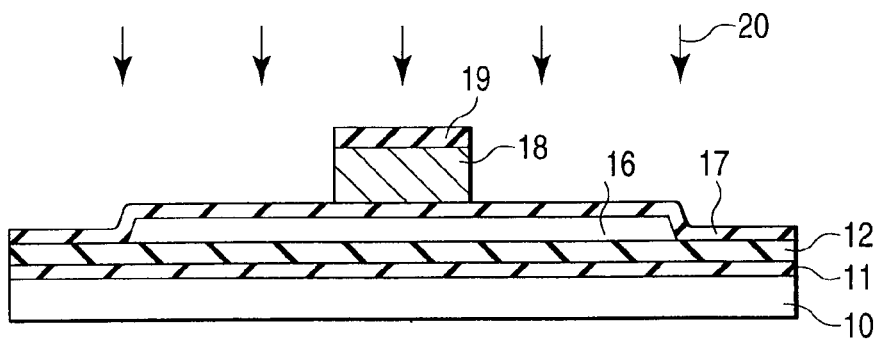
Figure 1J:
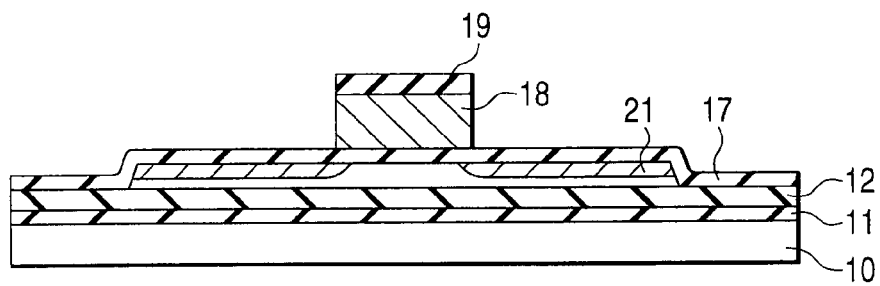
Figure 1K:
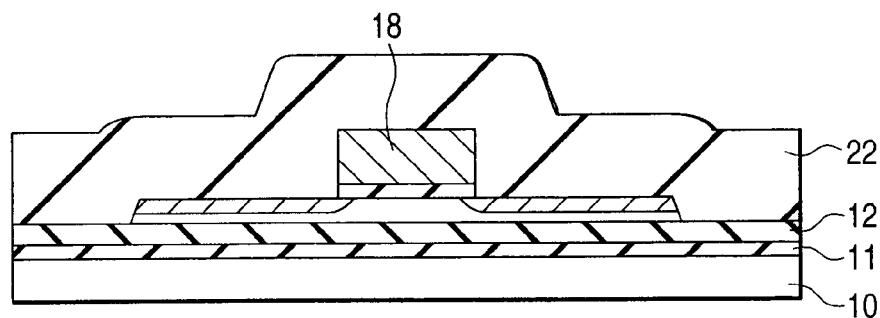
Figure 1L:
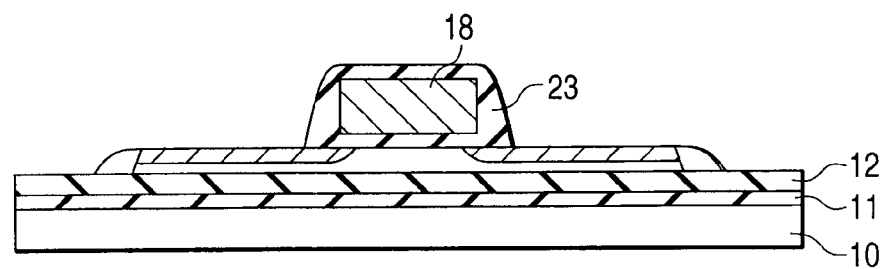
Figure 1M:
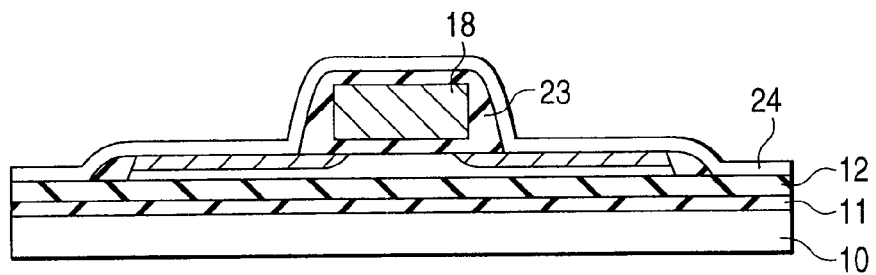
Figure 1N:
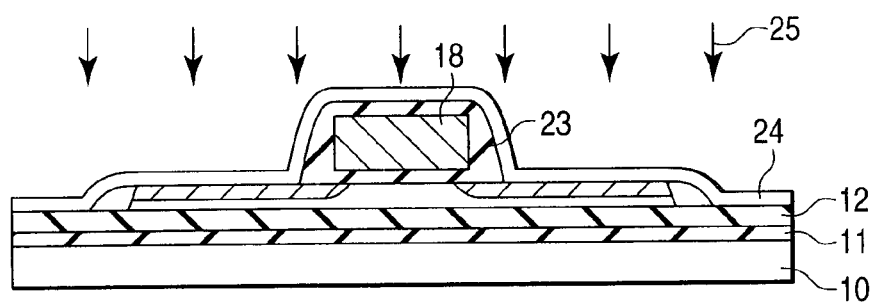
Figure 1O:
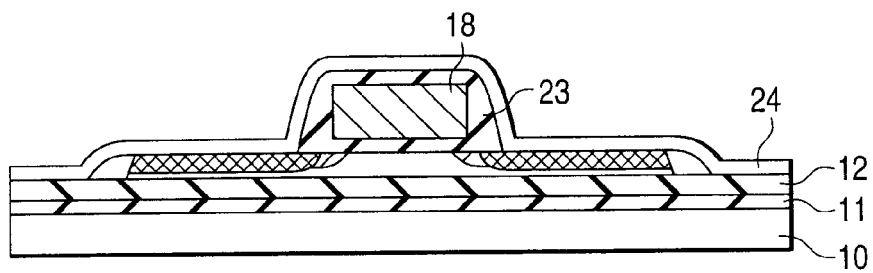
Figure 1P:
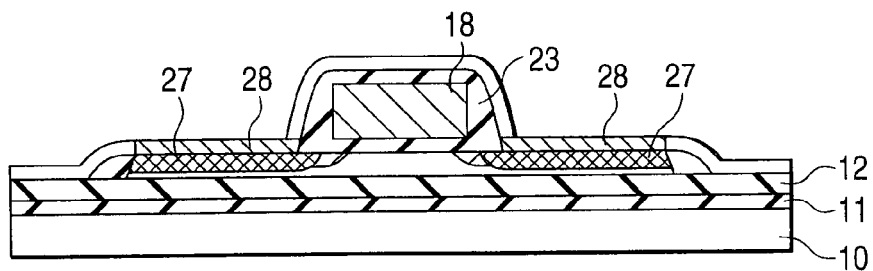
Figure 1Q:
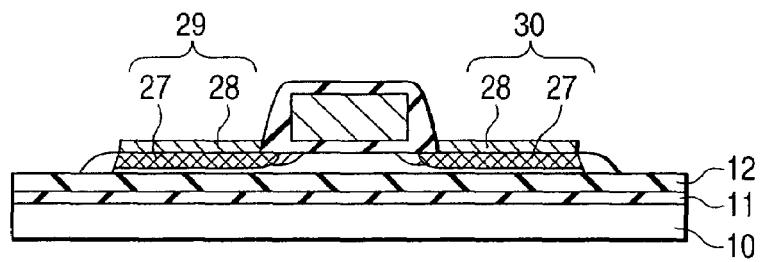
Figure 1R:
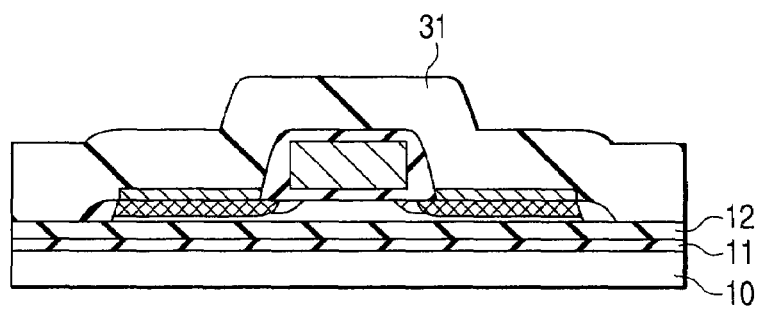
Figure 1S:
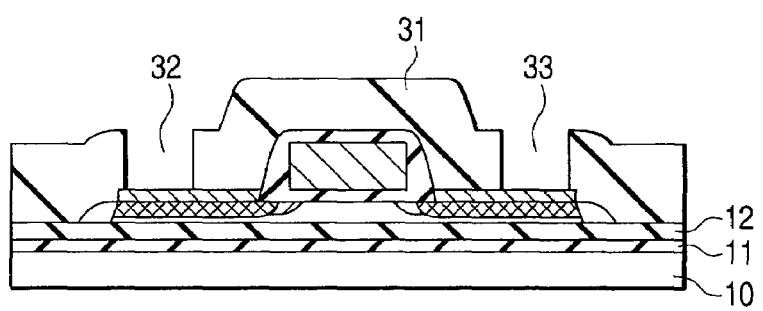
Figure 1T:
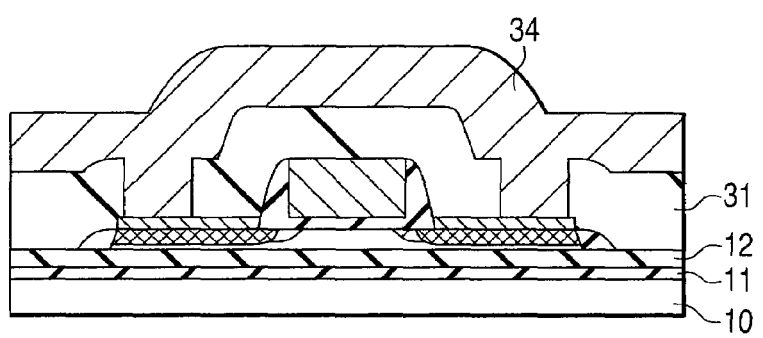
Figure 1U:
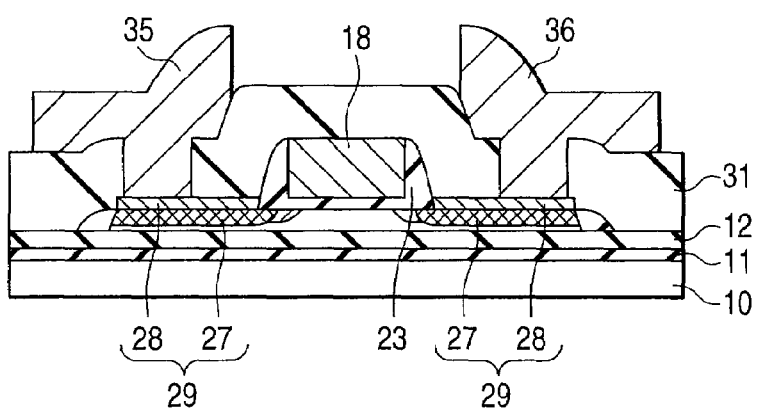

FIGS. 1A-1U are schematic cross-sectional views of the element portions of TFT for illustrating a sequence of the manufacturing steps of a polysilicon TFT according to one example corresponding to the first embodiment of the present invention.

As shown in FIG. 1A, a transparent insulating substrate 10 which is made of quartz or alkali-free glass commonly employed for a flat panel display is prepared. Incidentally, this insulating substrate 10 may be formed of a plastic substrate. However, there are strict requirements as for the properties of the insulating substrate 10 such as the warpage of substrate, thermal shrinkage, heat resistance, chemical resistance, etc. in addition to surface roughness and surface flaw, though they may differ depending on the specific display system.

Then, as shown in FIG. 1B, under coat layers 11 and 12 are formed on the surface of the insulating substrate 10. These under coat layers 11 and 12 are formed of a nitride film-series insulating film 11 having a thickness of 50 nm and a silicon oxide film ($SiO_2$) 12 having a thickness of 100 nm, respectively, each of which can be deposited on the transparent insulating substrate 10 by means of plasma CVD method for example.

Then, as shown in FIG. 1C, a non-monocrystal semiconductor film such as an amorphous semiconductor thin film 13 is formed on these under coat layers 11 and 12. This amorphous semiconductor thin film 13 may be an amorphous silicon film (a-Si) having a thickness of, for example, 100 nm, which can be deposited on the silicon oxide film of the under coat layer 12 by means of LP-CVD (Low Pressure CVD) method for example. The LP-CVD may be carried out under the conditions of: a $Si_2H_6$ atmosphere, 150 sccm in flow rate, 8 Pa in pressure, 450° C. in substrate temperature and 35 minutes in deposition time for example. Although the LP-CVD method is employed in this example, it is also possible to employ PE-CVD (low temperature plasma CVD) method for example. Subsequently, depending on the film conditions of the amorphous semiconductor thin film 13 thus formed, this thin film 13 may be subjected to a dehydrogenation treatment for eliminating the hydrogen contained in the film. As for the non-monocrystal semiconductor film, it may be a polycrystalline semiconductor film containing fine crystals.

Further, a light-transmitting insulating film (not shown) may be deposited, in some cases, as a sacrificial film for crystallization on the amorphous semiconductor thin film 13. This light-transmitting insulating film is permeable to an incident beam and is formed of a silicon oxide film having a thickness of 10 nm which can be deposited by means of LP-CVD method for example. This light-transmitting insulating film may be omitted in a case where a laser annealing method is employed.

Then, as shown in FIG. 1D, in order to crystallize the amorphous silicon, the amorphous semiconductor thin film 13 is subjected to a laser annealing treatment using, as an energy beam, XeCl excimer laser or KrF excimer laser 14 for example. Namely, the KrF excimer laser is irradiated, through a light-transmitting insulating film (not shown), to the amorphous semiconductor thin film 13, thereby heating the amorphous semiconductor thin film 13. The energy density of the KrF excimer laser may be about 350 mJ/cm$^2$. In the amorphous semiconductor thin film 13 which has been brought into a heated condition, the amorphous silicon is crystallized as polycrystalline silicon (polysilicon).

The step shown in FIG. 1E illustrates a state wherein the light-transmitting insulating film (not shown) that has been subjected to the laser annealing treatment is removed by making use of a solution such as dilute hydrofluoric acid or buffered hydrofluoric acid, thereby exposing a crystallized semiconductor thin film 15 as polysilicon.

Under this condition, a resist material is coated on the crystallized semiconductor thin film 15 and selectively irradiated by making use of a photo-mask. Subsequently, the resist material is selectively removed leaving only the masked region for forming a polysilicon TFT, thereby creating a resist pattern (not shown). Thereafter, the patterning of the crystallized semiconductor thin film 15 is performed by way of dry etching treatment using the resist pattern (not shown) as a mask, thereby forming a semiconductor thin film pattern 16. In this dry etching treatment, a mixed gas consisting of $CF_4$ and $O_2$ for example may be employed as an etching gas. After this dry etching, the resist pattern is removed from the semiconductor thin film pattern 16 by way of a dipping treatment using an organic stripping solution, thus obtaining a structure shown in FIG. 1F.

Subsequently, as shown in FIG. 1G, a gate insulting film 17 is deposited on the surface of the semiconductor pattern 16. This gate insulting film 17 is formed of a silicon oxide film having a thickness of 30 nm which is deposited on the semiconductor pattern 16 by means of a plasma CVD method for example. This plasma CVD may be performed using, as a reaction gas, tetraethyl orthosilicate: $Si(OC_2H_5)_4$ {which may be abbreviated as TEOS (tetraethoxy silane)} and under the condition of 350° C. in substrate temperature.

Thereafter, an impurity of very low concentrations may be implanted into the regions of the semiconductor pattern 16 which are designed to be turned into an n-type MOS and a p-type MOS. In order to control the threshold value of the n-type MOS, p-type impurity doping is performed. This is performed for the purpose of precisely controlling the threshold voltage Vth of not only the n-type TFT but also the p-type TFT, since the logic circuit such as CMOS inverter for instance is constituted by a combination of an n-channel polysilicon TFT and a p-channel polysilicon TFT. For the purpose of precisely controlling the threshold voltage Vth for forming the n-type TFT, the doping is carried out under the conditions of: $^{49}BF_2^+$, 50 keV and $5\times10^{12}/cm^{-2}$. In this case, the region of the p-type MOS transistor may be also doped with the impurity. However, the employment of masking by making use of a resist dare not to be done for the purpose of simplifying the process (the number of masks can be reduced). Instead, this problem may be coped with by the adjustment of doping quantity to be performed in the next step for controlling the threshold value of the p-type MOS transistor. Although the adjustment of doping quantity of the n-type MOS transistor is performed by way of ion implantation in this step, it is also possible to perform the adjustment of doping quantity by the addition of boron on the occasion of forming an amorphous silicone film for forming a semiconductor film.

Then, a photo-mask (not shown) for the doping of an n-type impurity for controlling the threshold value of the p-type MOS transistor is formed and then the doping of an n-type impurity is performed. The doping conditions on this occasion are: $^{31}P^+$ as an impurity, 50 keV in accelerating voltage and $5\times10^{12}/cm^{-2}$ in dosage. With respect to the impurity implantation step for controlling these threshold voltages, the n-type impurity implantation step and/or the p-type impurity implantation step may be sometimes omitted in view of the fluctuation of the threshold voltage Vth that may be caused by the stationary electric charge within the film or the interfacial level thereof, or in view of the target performance of device or of the circumstances of related processes, or in view of the simplification of process.

As a result of the aforementioned steps, the impurity doping of desired concentrations in the regions for creating the n-type MOS and the p-type MOS is accomplished and hence the photoresist is removed by way of dipping treatment using an organic stripping solution. Subsequently, the heat treatment for activating the ions implanted in the Si is required. However, this activating heat treatment is generally carried out collectively in a subsequent heat treatment step.

Then, an electrode layer is formed on the gate insulating film 17. This electrode layer is formed of a high-melting point metal layer MoW having a thickness of 200 nm, which can be deposited on the silicon oxide film of the gate insulating film 17 by means of sputtering for instance. Specifically, the deposition of this film can be performed by means of DC sputtering under the conditions of: 100° C. in substrate temperature, 4 mTorr in Ar pressure, 2 kW in supply power and 60 seconds in discharging time. Further, on the occasion of forming the electrode layer, an electrode protecting layer formed of an insulating film may be successively deposited.

Subsequently, a resist material is coated on the electrode protecting layer and selectively irradiated by making use of a photomask. Thereafter, the resist material is selectively removed leaving ones located in the gate electrode-forming mask region, thereby forming a resist pattern (not shown). Then, by way of dry etching treatment using the resist pattern as a mask, the patterning of the electrode protecting layer and of the electrode layer is continuously performed to form an electrode protecting layer 19/gate electrode 18 having a 2-ply structure. In this dry etching treatment, a mixed gas consisting of $Cl_2$ and $O_2$ is employed as an etching gas for instance and the fine working is performed by making use of a high-density plasma etching under the conditions of: 25 mTorr in pressure, 1 kW in microwave power, and 25W in high-frequency power for lower electrodes. Subsequently, the resist pattern deposited on the gate electrode 19 is removed by a process comprising a 20-minutes ashing treatment using $O_2$ plasma and a dipping treatment using an organic stripping solution, thereby obtaining the structure shown in FIG. 1H.

Then, as shown in FIG. 1I, a step of the Si ion or Ge ion implantation (or doping) for both of the n-type MOS and the p-type MOS is collectively performed to the semiconductor layer 16. This ion implantation step is performed for the purpose of solving the problems that crystal defects may be caused to generate on the occasion of a subsequent impurity implantation (n− and p− impurity implantation) at low concentration as well as on the occasion of a subsequent impurity implantation (n$^+$ and p$^+$ impurity implantation) at high concentration for forming the n-type MOS and the p-type MOS and that these defectives may not be remedied by a low temperature process to be executed in the following annealing treatment. Namely, this Si ion implantation step is performed for the purpose of facilitating the recovery of crystal.

Since the Si crystal is forcedly destroyed in the order of atom by the injecting energy on the occasion of Si implantation so as to amorphize the Si crystal in this Si implantation method, this method is called "PAI: Pre-amorphization Implants". The PAI conditions on this occasion are: Si$^+$, 35 keV and $2 \times 10^{15}/cm^{-2}$.

Subsequently, by means of photolithography, a resist pattern (not shown) is formed for the subsequent n-type and p-type impurity implantations at low concentrations and then, by making use of the gate electrode 18 and the resist pattern as a mask, n-type and p-type impurities of low concentrations are injected to the amorphized semiconductor thin film 16. When it is desired to make the polysilicon TFT into an n-channel type, phosphorus is ion-implanted (doping) to the semiconductor thin film 16. When it is desired to make the polysilicon TFT into a p-channel type, boron is ion-implanted (doping) to the semiconductor thin film 16. On this occasion, the ion implantation to one of the n-channel polysilicon TFT and the p-channel polysilicon TFT is performed by covering the semiconductor thin film 16 of the other polysilicon TFT by making use of a mask (not shown) such as a resist mask for preventing the undesirable ion implantation.

Subsequently, the resist pattern for implanting an n-type or a p-type impurity at low concentration is removed and a new resist pattern (not shown) for implanting a remaining one of the n-type impurity and the p-type impurity at low concentration is formed by means of photolithography. Then, by making use of the gate electrode 19 and the resist pattern as a mask, an impurity of low concentrations is injected to the amorphized semiconductor thin film 16. Incidentally, there is no limitation with regard to the order of implanting the n-type impurity and the p-type impurity of low concentrations. Namely, the n-type impurity may be implanted prior to the p-type impurity and vice versa. With respect to the conditions for the ion implantation to each of the n-channel polysilicon TFT and the p-channel polysilicon TFT, they may be $^{31}P^+$, 50 keV and $5 \times 10^{13}/cm^{-2}$ for the n-channel polysilicon TFT and $^{49}BF_2^+$, 50 keV and $5 \times 10^{13}/cm^{-2}$ for the p-channel polysilicon TFT.

After finishing the ion implantation to the p-channel polysilicon TFT, the resist pattern is removed. Incidentally, the low concentration impurity implantation step to the p-channel polysilicon TFT may be sometimes omitted in view of the target performance of device or of the circumstances of related processes, or in view of the simplification of process. The cross-sectional view of FIG. 1J illustrates a state where an impurity is implanted at low concentration, indicating the formation of a low concentration impurity layer 21 in the semiconductor pattern 16.

Subsequently, as shown in FIG. 1K, by making use of a plasma CVD method, an insulating film 22 (a sacrificial film SiO$_2$ for a sidewall spacer) is formed for forming a sidewall spacer. With respect to the conditions on this occasion, SiH$_4$ gas and O$_2$ gas may be employed as reaction gases and the temperature for forming the film 22 may be set to 350° C.

Then, as shown in FIG. 1L, the dry etching of the insulating film 22 is performed for forming the sidewall spacer. In this case, the insulating film 22 is uniformly etch-backed so as to reduce the thickness of the insulating film 22 by a thickness corresponding to the thickness thereof. With respect to the conditions for the dry etching on this occasion, it can be performed by executing a directional dry etching such as a reactive ion etching (RIE) system using CHF$_3$ gas as an etching gas. In this step of forming the sidewall spacer 23, the thickness of the insulating film 22 is adjusted so as to obtain a desired sidewall width W. In this embodiment, the thickness of the insulating film 22 is adjusted so as to secure 0.2 μm as the sidewall width W. FIG. 1L illustrates a state wherein the sidewall spacer 23 is formed on the sidewall of the gate electrode 18.

Then, as shown in FIG. 1M, an amorphous semiconductor thin film 24 is deposited all over the substrate including the semiconductor layer 21 and the pattern of gate electrode 18. This semiconductor thin film 24 is an amorphous silicon film (a-Si) having a thickness of 100 nm for example and may be deposited in the same manner as in the case of the aforementioned semiconductor thin film 15 by making use of, for example, LP-CVD (Low Pressure CVD). This LP-CVD may be carried out under the conditions of: a Si$_2$H$_6$ atmosphere, 150 sccm in flow rate, 8 Pa in pressure, 450° C. in substrate temperature and 35 minutes in deposition time for example. Although the LP-CVD method is employed in this example, it is also possible to employ PE-CVD (low temperature plasma CVD) method for example.

Further, first of all, a resist pattern (not shown) for implanting an n-type or p-type impurity at high concentration is formed by means of photolithography. Then, by making use of this resist pattern as a mask, a high concentration of an n-type or p-type impurity is injected to the amorphous semiconductor thin film 24. Namely, as shown in FIG. 1N, when it is desired to make the polysilicon TFT into an n-channel type, phosphorus is ion-implanted (doping) to the semiconductor thin film 24. When it is desired to make the polysilicon TFT into a p-channel type, boron is ion-implanted (doping) to the semiconductor thin film 24. On this occasion, the ion implantation to one of the n-channel polysilicon TFT and the p-channel polysilicon TFT is performed by covering the semiconductor thin film 24 of the other polysilicon TFT by making use of a mask (not shown) such as a resist mask for preventing the undesirable ion implantation.

Subsequently, the resist pattern for implanting an n-type or a p-type impurity at high concentration is removed and a new resist pattern (not shown) for implanting a remaining one of the n-type impurity and the p-type impurity at high concentration is formed by means of photolithography. Then, by making use of this resist pattern as a mask, an impurity of high concentrations is injected to the semiconductor thin film 24. Incidentally, there is no limitation with regard to the order of implanting the n-type impurity and the p-type impurity of high concentrations. Namely, the n-type impurity may be implanted prior to the p-type impurity and vice versa. With respect to the conditions for the ion implantation to each of the n-channel polysilicon TFT and the p-channel polysilicon TFT, they may be $^{31}P^+$, 35 keV and $2 \times 10^{15}/cm^{-2}$ for the n-channel polysilicon TFT and $^{49}BF_2^+$, 35 keV and $2 \times 10^{15}/cm^{-2}$ for the p-channel polysilicon TFT. After finishing the ion implantation to the p-channel polysilicon TFT or to the n-channel polysilicon TFT, the resist pattern is removed.

FIG. 10 shows a state wherein the resist pattern is removed after finishing the implantation of n-type and p-type impurities at high concentrations.

Then, a first heat treatment (low temperature solid state growth, for example, a solid state growth at a temperature of not higher than 600° C.) for activating and restoring the crystallinity of only the crystallizing regions of the amorphous semiconductor thin film 24 is performed. As a method of heat treatment, furnace treatment (500° C. for two hours) for example is employed. Rather than applying a high power so as to fuse and recrystallize a film as in the case of the local heating system such as the flash lamp annealing system or the laser annealing system, this heat treatment is applied under a low power condition (in terms of irradiation energy density, irradiation fluence) so as to generate a low temperature solid state growth. Therefore, a heating system such as the furnace annealing system is ideal in this case. By heating the amorphous semiconductor thin film 24 in this manner, the amorphous semiconductor thin film 24 is enabled to restore the crystallinity in the direction of surface thereof just like an epitaxial growth with the underlying recrystallized semiconductor thin film 27 being utilized as a seed (see crystal). Concurrent with this heating, the impurity introduced in the thin film is activated.

On this occasion, since the underlying layer of all of the regions other than the source/drain regions is constituted by an insulating film, i.e. non-existence of a seed for crystal growth, the regions other than the source/drain regions is left in an amorphous state without restoration of crystallinity. In this manner, only the desired source/drain diffusion regions are enabled to restore the crystallinity thereof in a self-aligned manner, thus obtaining the structure shown in FIG. 1P wherein the regions of single crystal/polycrystal state are distinguished from the regions of amorphous state.

Then, by making use of a selecting etchant, the etching is performed so as to remove only the amorphous Si layer to form the stacked structures 29 and 30 of the source/drain regions wherein the polycrystalline Si layer 28 deposited on the source/drain diffusion regions is permitted to leave in a self-aligned manner as shown in FIG. 1Q. The etchant to be employed herein may be a mixed solution comprising acetic acid ($CH_3COOH$), nitric acid ($HNO_3$) and hydrofluoric acid (HF) for example.

Thereafter, as shown in FIG. 1R, an interlayer insulating film 31 is deposited on the source region 29 and the drain region 30. This interlayer insulating film 31 is formed of a silicon oxide film having a thickness of 500 nm and deposited, by means of plasma CVD for example, on the surfaces of the gate electrode 18 formed of a high-melting point metal, the source region 29 and the drain region 30. This plasma CVD can be performed under the conditions of: 350° C. in substrate temperature and 20 minutes in deposition time for example.

Then, a resist pattern is formed at first by means of photolithography and then the interlayer insulating film 31 is subjected to a dry etching treatment using the aforementioned resist pattern as a mask, thereby creating contact holes 32 and 33, thus partially exposing the source region 29 and the drain region 30 as shown in FIG. 1S. In this dry etching, $CHF_3$ for example can be employed as an etching gas. FIG. 1S illustrates a state where the resist pattern is removed from the interlayer insulating film 31. The resist pattern can be removed under the conditions of: a 20-minutes ashing treatment using $O_2$ plasma and a dipping treatment using an organic stripping solution.

Then, as shown in FIG. 1T, metallic electrode film 34 is deposited on the interlayer insulating film 31 so as to fill the contact holes 32 and 33 formed respectively in a portion of the interlayer insulating film 31 with the metallic electrode film 34. This metallic electrode film 34 is connected, via the metal buried in these contact holes 32 and 33, with the source region 29 and the drain region 30. The metallic electrode film 34 is formed of a laminate film consisting of a 400 nm-thick aluminum and 100 nm-thick Ti, which are deposited on the silicon oxide film of the interlayer insulating film 31 by means of DC sputtering for instance. The sputtering conditions for this metallic electrode film may be: 100° C. in substrate temperature, 4 mTorr in Ar pressure, and 2 kW in RF power in the case of the Ti film having a thickness of 100 nm; and 100° C. in substrate temperature, 4 mTorr in Ar pressure, and 10 kW in RF power in the case of the Al film.

Then, a resist material is coated on the surface of the metallic electrode film 34 and then selectively irradiated by making use of a photomask, thereby removing all of the resist material excluding portions thereof deposited on the masked source electrode region and on the masked drain electrode region, thus forming a resist pattern. Subsequently, by way of dry etching treatment using this resist pattern as a mask, the metallic electrode film 34 is patterned to form the source electrode 35 and the drain electrode 36 as shown in FIG. 1U. In this dry etching treatment, an etching gas consisting of $BCl_3$ and $Cl_2$ for example may be used as an etching gas and the laminate film consisting of aluminum and Ti can be collectively etched under the conditions of: 30 SCCM in flow rate of $BCl_3$ and 20 SCCM in flow rate of $Cl_2$, 15 mTorr in pressure and 30W in RF power. Subsequently, the resist pattern is removed from the source electrode 35 and the drain electrode 36, thereby accomplishing the polysilicon TFT.

EXAMPLE 2

This example is a modified example of the first embodiment of the present invention.

This example differs from Example 1 in the respect that the step of implanting impurities ($n^+$, $p^+$) at high concentrations that has been conducted immediately after finishing the step of depositing amorphous Si for forming the stacked structure in Example 1 is executed after finishing the step of low temperature solid state growth and the step of selective etching (the step of forming a stacked amorphous Si layer in a self-aligned manner) in this example.

The merit of this example resides in that since impurity is not existed in the film on the occasion of performing the solid state growth at a low temperature such as a temperature of not higher than 600° C., the velocity of the solid state growth can be increased. However, since the Si that has been grown by way of the solid state growth is subsequently pre-amorphized to secure excellent activation characteristics, it is possible to obtain excellent device characteristics which are comparative to those of Example 1.

First of all, the steps shown in FIGS. 1A-1L are executed to form the sidewall spacer 23 on the sidewall of the gate electrode 18 as shown in FIG. 1L. Then, as shown in FIG. 2A, an amorphous Si layer 24 is deposited all over the surface of substrate including the semiconductor layer 21 and the gate electrode pattern 18. The steps up to this moment are the same as those conducted in Example 1.

Then, a first heat treatment (low temperature solid state growth) for activating and restoring the crystallinity of only the crystallizing regions of the amorphous semiconductor thin film 24 is performed. This heat treatment is performed under the same conditions as the heat treatment shown in FIG. 1P of Example 1. By performing the heat treatment in this manner, the amorphous semiconductor thin film 24 is enabled to restore the crystallinity in the direction of surface thereof just like an epitaxial growth with the underlying recrystallized semiconductor thin film 27 being utilized as a seed (see crystal).

On this occasion, since the underlying layer of all of the regions other than the source/drain regions is constituted by an insulating film, i.e. non-existence of a seed for crystal growth, the regions other than the source/drain regions is left in an amorphous state without restoration of crystallinity. In this manner, only the desired source/drain-forming regions are enabled to restore the crystallinity thereof in a self-aligned manner, thus forming the regions of single crystal/polycrystal state which are distinguished from the regions of amorphous state.

Then, by making use of a selecting etchant, the etching is performed so as to remove only the amorphous Si layer to form the stacked structures of the predetermined source/drain-forming regions wherein the polycrystalline Si layer 28 deposited on the source/drain diffusion regions is permitted to leave in a self-aligned manner as shown in FIG. 2C. This etching step can be performed under the same conditions as those of the step of FIG. 1Q of Example 1.

Thereafter, as shown in FIG. 2D, the implantation of impurity is performed at high concentration. In this step of implanting an impurity at high concentration, a step of ion implantation (or doping) of Si or Ge is first applied to the source region 29 and the drain region 30 that have been collectively stacked in a self-aligned manner in both of the n-type MOS and the p-type MOS. Subsequently, by means of photolithography, a resist pattern (not shown) is formed for the subsequent n-type and p-type impurity implantations at high concentrations and then, by making use of the resist pattern as a mask, n-type and p-type impurities of high concentrations are injected to the source region 29 and the drain region 30. When it is desired to make the polysilicon TFT into an n-channel type, phosphorus is ion-implanted (doping) to these regions. When it is desired to make the polysilicon TFT into a p-channel type, boron is ion-implanted (doping) to these regions. Subsequently, the resist pattern (not shown) for implanting an n-type or a p-type impurity at high concentration is removed and a new resist pattern (not shown) for implanting a remaining one of the n-type impurity and the p-type impurity at high concentration is formed by means of photolithography. Then, by making use of the resist pattern (not shown) as a mask, an impurity of high concentrations is injected to the source region 29 and the drain region 30. Incidentally, there is no limitation with regard to the order of implanting the n-type impurity and the p-type impurity of high concentrations. Namely, the n-type impurity may be implanted prior to the p-type impurity and vice versa. With respect to the conditions for the ion implantation to each of the n-channel polysilicon TFT and the p-channel polysilicon TFT, they may be $^{31}P^+$, 35 keV and $2\times10^{15}/cm^{-2}$ for the n-channel polysilicon TFT and $^{11}BF_2^+$, 50 keV and $2\times10^{15}/cm^{-2}$ for the p-channel polysilicon TFT.

After finishing the ion implantation to the p-channel type or n-channel type polysilicon TFT, the resist pattern (not shown) is removed.

EXAMPLE 3

This example corresponds to the second embodiment of the present invention and is directed to a method of manufacturing a polysilicon TFT having a device structure with excellent source/drain characteristics wherein a self-aligned type stacked Si layer is lined with a silicide layer.

Namely, in this example, steps are additionally applied to the process of Example 1 in such a manner that a high-melting point metal layer is deposited on the self-aligned type stacked Si layers 29 and 30 that have been formed in the step shown in FIG. 1Q and the high-melting point metal layer is subjected to a first heat treatment to form silicide, after which unreacted high-melting point metal layer is removed and then the silicide is subjected to a second heat treatment to convert the metastable silicide layer into a silicide layer of stable-state.

Next, the test for siliciding a high-melting point metal film, which have been conducted by the present inventor will be explained. In this siliciding test, an LPCVD polysilicon film having a thickness of 100 nm and deposited on a quartz substrate was washed with DHF+hydrogen water and then Ni was deposited to a thickness of 50 nm on the LPCVD poly-silicon film, thereby obtaining a precursor. By making use of an RTA apparatus, the heat treatment was performed based on the ordinary processing sequence and in a $N_2$ atmosphere. More specifically, throughout a sequence of test, preheating was performed at 200° C. for 40 seconds, the temperature-rising rate was set to 10° C./sec, the temperature-dropping rate was not controlled, and the heating was performed by way of indirect heating using a Si suceptor, wherein the control of temperature was performed by monitoring the temperature of the suceptor by making use of a pyrometer.

Upon finishing the heat treatment of the film, the film was subjected to a wet etching treatment using a solution of $H_2SO_4+H_2O_2$ (2:1 in ratio) for 5 minutes at 100° C., thereby removing unreacted Ni.

In the evaluation of the film formed, the electric resistance was measured by way of four probe method of the resistivity measurement, the identification of the produced $Ni_xSi_y$ phase was performed by means of XRD (X-ray Diffraction), and the surface morphology and the observation of formed film thickness were performed by means of SEM (Scanning Electron Microscopy).

First of all, when the sheet resistance of the $Ni_xSi_y$ thin film was measured, it was 31.4 $\Omega/\square$ when the heat treatment temperature thereof was 400° C., which was lower than the sheet resistance of 100 $\Omega/\square$. Further, when the heat treatment temperature thereof was increased to 500° C., the sheet resistance thereof was as very low as 4.0 $\Omega/\square$. This value obtained from the heat treatment of 400° C. was found approximately a half of the sheet resistance of the $Ti_xSi_y$ thin film which was examined in advance. Further, the value obtained from the heat treatment of 500° C. was about 1/20 of the sheet resistance of the $Ti_xSi_y$ thin film. In view of these facts, it was possible to confirm that when a submicron TFT is assumed to be formed on a glass substrate, the method of the present invention will be very promising as a technique to form low resistance source/drain regions at low temperatures. Incidentally, it has been also confirmed that the Ti film and the Ni film before the heat treatment thereof were formed of a polycrystalline structure having a (111) orientation as a priority orientation, and that even when Zr, Ti and Co were employed, they were also formed of a polycrystalline structure having a (111) orientation as a priority orientation.

The crystal configuration of the Ni film after the RTA was formed of a monosilicide structure after the first heat treatment and even after the second heat treatment, the crystal configuration of the Ni film was formed of a monosilicide structure without accompanying phase transformation.

Further, the flatness of the silicide/Si was found poor. The reason for this may be conceivably attributed to the fact that the crystallinity of the silicide film or Si film is badly affected by the difference in siliciding reaction rate among the crystals or by the crystal grain boundaries due to the polycrystalline structure thereof.

Figure 3A:
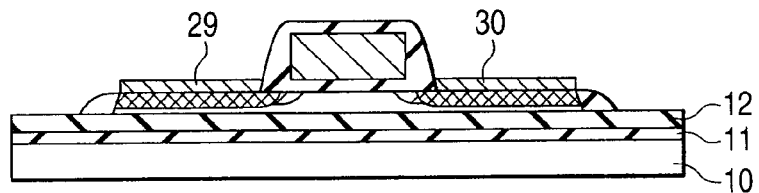
FIGS. 3A-3F are cross-sectional views each illustrating the manufacturing steps of a polysilicon thin film transistor according to Example 3.

In this example, after the steps shown in FIGS. 1A-1P, the stacked structures 29 and 30 of the source/drain regions are formed by means of selective etching as shown in FIG. 3A. The steps up to this moment are the same as those conducted in Example 1.

Figure 3B:
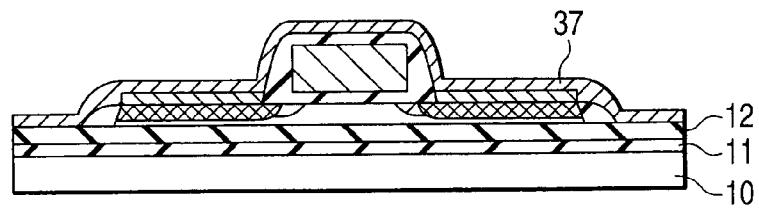

Then, as shown in FIG. 3B, as a preliminary step for forming a high-melting point metal silicide layer, a high-melting point metal thin film 37 is formed according to the conventional method. This high-melting point metal thin film 37 can be formed by means of a DC magnetron sputtering system after the atmosphere is evacuated to a state of vacuum in general. In this example, the high-melting point metal thin film 37 having a thickness of 50 nm was formed by adjusting the RF power and the degree of vacuum. The high-melting point metal thin film 37 thus obtained was found formed of a polycrystalline layer exhibiting a strong (111) orientation. With respect to the state of crystal, it is possible, by variously modifying the film formation conditions, to obtain various configurations including crystal grain size, granular structure and columnar structure. However, they were always formed of polycrystalline structure.

With respect to the high-melting point metal for constituting the high-melting point metal thin film 37, it is possible to employ Ti, Co, Ni, W, Mo, etc.

Figure 3C:
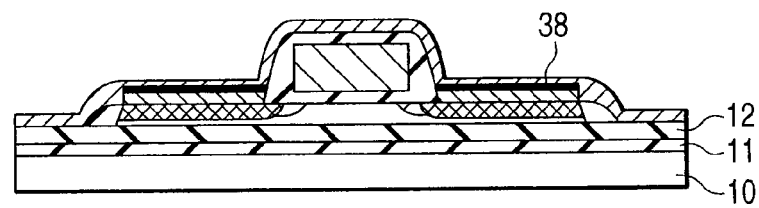

Then, in the step shown in FIG. 3C, the heat treatment using a lamp annealing is performed as a heat treatment for effecting the siliciding reaction. The heat treatment on this occasion is intended to execute the first siliciding as a metastable state and therefore is executed at a relatively low temperature as compared with the heat treatment to be performed for the second siliciding to be explained hereinafter. In this example, the heat treatment was performed by making use of an RTA (rapid thermal annealing) using a tungsten halogen lamp and at a temperature of not higher than 500° C.

Figure 3D:
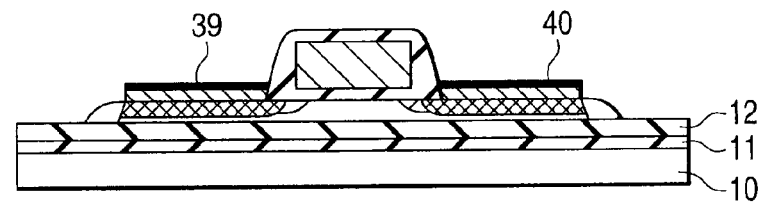

Then, the resultant body is dipped in a solution which is capable of dissolving unreacted high-melting point metal and incapable of dissolving a high-melting point metal silicide, thereby leaving, in a self-aligned manner, high-melting point metal silicide layers 39 and 40 only on the surface of the source/drain regions as shown in FIG. 3D. In this selective etching treatment, an aqueous solution of $H_2SO_4+H_2O_2$ or an aqueous solution of $NH_4OH+H_2O_2$ can be employed.

Figure 3E:
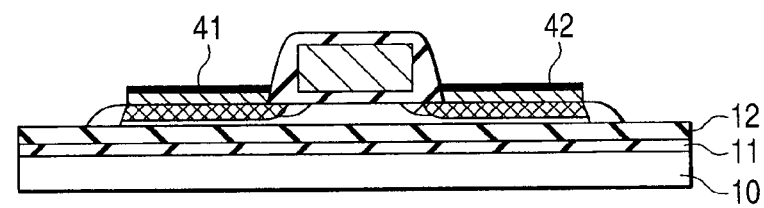

Subsequently, a heat treatment for forming a stable silicide layer is applied to the high-melting point metal silicide layers 39 and 40 of metastable state. As for the heat treatment to be performed herein, it is possible to employ any of laser annealing, flash lamp annealing, halogen lamp annealing and a heat treating furnace. These heat treatments may be selected in conformity with the design rule of the device. Due to this heat treatment, the silicide layers 39 and 40 of metastable state that have been formed by the first heat treatment are turned into stable state silicide layers 41 and 42 as shown in FIG. 3E. In this example, since the impurity is enabled to move along the interface of the silicide layer while being segregated, the silicide/Si interface can be maintained in a state exhibiting a high impurity concentration.

Figure 3F:
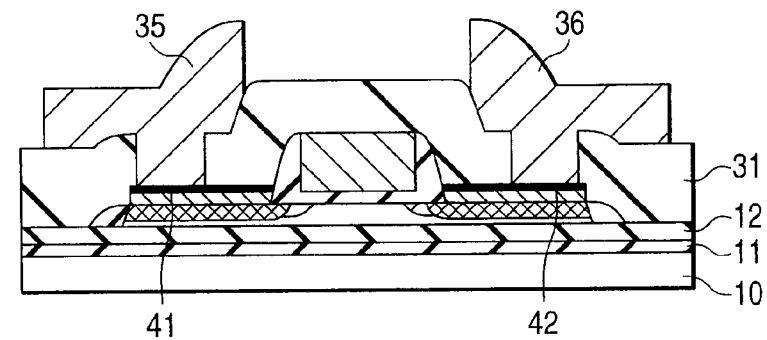

Subsequently, the resultant body is subjected to the same steps as explained in Example 1 to accomplish the polysilicon TFT as shown in FIG. 3F.

EXAMPLE 4

In this example, the high concentration impurity ($n^+$, $p^+$) implantation step (FIG. 1N) which was performed immediately after finishing the amorphous Si deposition step for creating a stacked structure in Example 3 just like Example 1 was executed after the step of low temperature solid state growth and the step of selective etching (the step of forming a stacked amorphous Si layer in a self-aligned manner) as described in Example 2.

According to this example, since the self-aligned type stacked Si layer is lined with a silicide layer as in the case of Example 3, it is possible to obtain a polysilicon TFT having a device structure provided with more excellent source/drain characteristics and, at the same time, since impurity is not existed in the film on the occasion of performing the solid state growth at a low temperature, the velocity of the solid state growth can be advantageously increased.

Figure 4A:
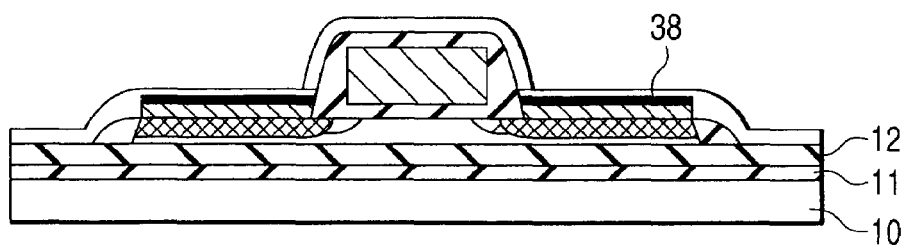
FIGS. 4A-4D are cross-sectional views each illustrating the manufacturing steps of a polysilicon thin film transistor according to Example 4.

In this example, the steps shown in FIGS. 1A-1M are executed in the same manner as explained in Example 1. However, the high concentration impurity ($n^+$, $p^+$) implantation step shown in FIG. 1N is not executed. Instead, the step of the low temperature solid state growth as shown in FIG. 2B is executed. Thereafter, in the same manner as described in Example 3, the selective etching and the high-melting point metal film formation step are executed as shown in FIGS. 3A and 3B and then the first heat treatment is executed as shown in FIG. 4A, thereby forming a silicide layer 38.

Figure 4B:
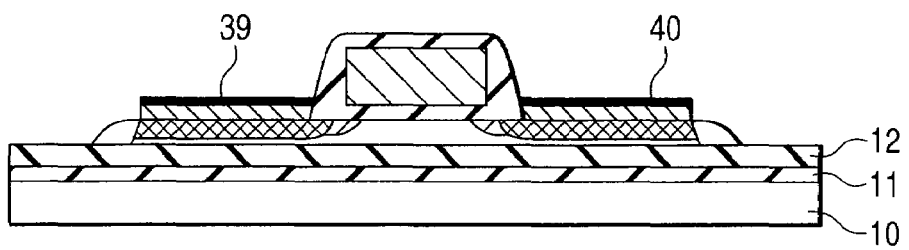
Figure 4C:
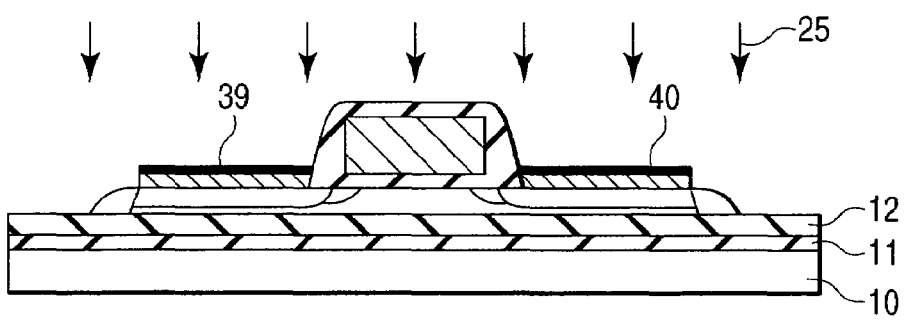

Then, as shown in FIG. 4B, selective etching for removing the unreacted high-melting point metal film is performed. Then, as shown in FIG. 4C, the step of implanting high concentration impurity ($n^+$, $p^+$) 25 is executed at this stage. In this case, a step of ion implantation (or doping) of Si or Ge may be collectively applied to both of the n-type MOS and the p-type MOS before the high-concentration impurity implanting step.

Figure 4D:
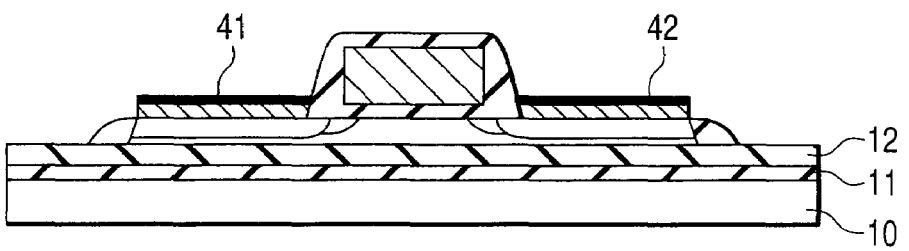

Subsequently, the second heat treatment is performed in the step shown in FIG. 4D, thereby converting the metastable silicide layers 39 and 40 that have been formed in the first heat treatment into stable state silicide layers 41 and 42.

Subsequently, the resultant body is subjected to the same steps as explained in Example 1 to accomplish the polysilicon TFT as shown in FIG. 3F of Example 3.

In this example, since the step of implanting high concentration impurity ($n^+$, $p^+$) is performed after finishing the first siliciding step, it is possible to retain high impurity concentration as in the case of Example 3, thereby improving the contact characteristics between the silicide/Si layers.

EXAMPLE 5

In this example, just like Example 2, the step of implanting high concentration impurity ($n^+$, $p^+$) is performed after the formation of the stacked silicon layer as shown in FIGS. 2A-2D. Then, the formation of the high-melting point metal film and the siliciding reaction are executed.

Figure 5A:
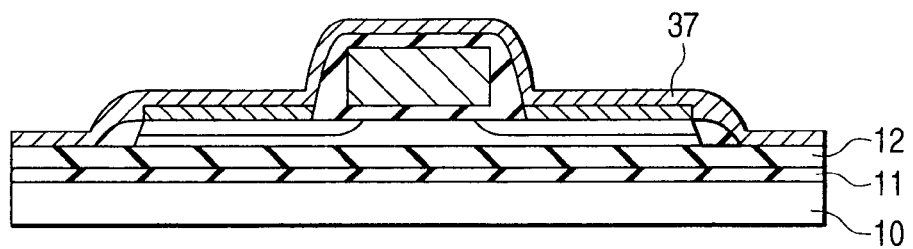
FIGS. 5A-5D are cross-sectional views each illustrating the manufacturing steps of a polysilicon thin film transistor according to Example 5.

More specifically, the implantation of high concentration impurity ($n^+$, $p^+$) is performed at first as shown in FIG. 2D. Then, the high-melting point metal thin film 37 is formed in the same manner as described in Example 3 as shown in FIG. 5A. In this case, a step of ion implantation (or doping) of Si or Ge may be collectively applied to both of the n-type MOS and the p-type MOS before the high-concentration impurity implanting step.

Figure 5B:
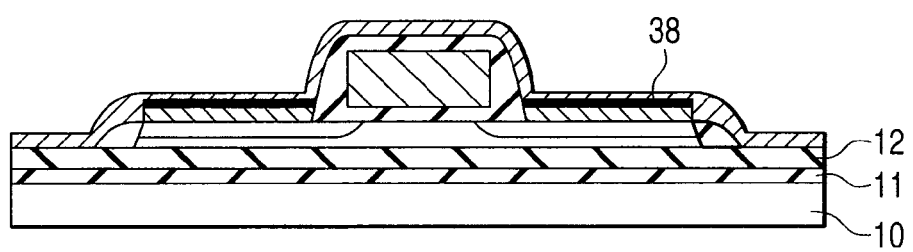
Figure 5C:
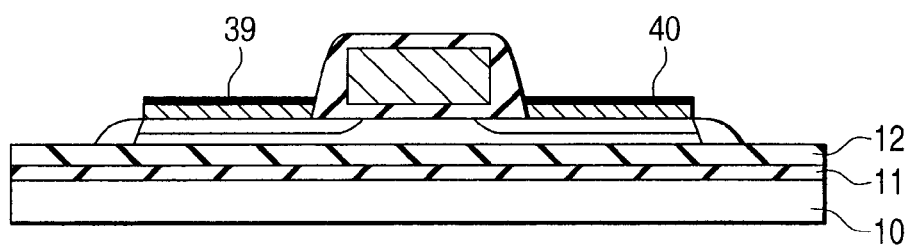
Figure 5D:
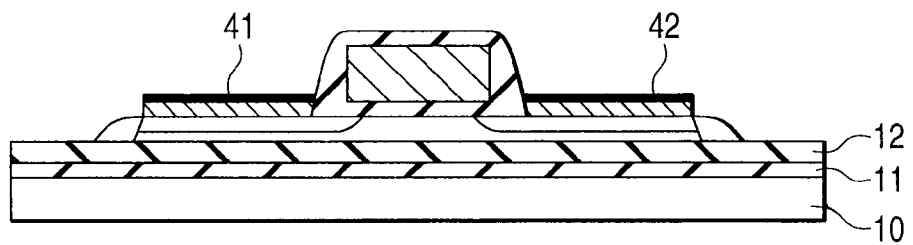

Subsequently, in the step shown in FIG. 5B, the first heat treatment for the siliciding is performed in the same manner as described in Example 3. Then, as shown in FIG. 5C, the unreacted high-melting point metal is removed by way of selective etching and then the second heat treatment for forming a stable silicide layer is performed as shown in FIG. 5D.

Subsequently, the resultant body is subjected to the same steps as explained in Example 1 to accomplish the polysilicon TFT as shown in FIG. 3F.

According to this example, since the self-aligned type stacked Si layer is lined with a silicide layer as in the case of Example 3, it is possible to obtain a polysilicon TFT having a device structure provided with more excellent source/drain characteristics.

Next, one example wherein the polysilicon TFT obtained in the above-described example is actually applied to an active matrix type liquid crystal display device will be explained. This liquid crystal display device is provided with an ordinary display mode and a static picture display mode.

Figure 7:
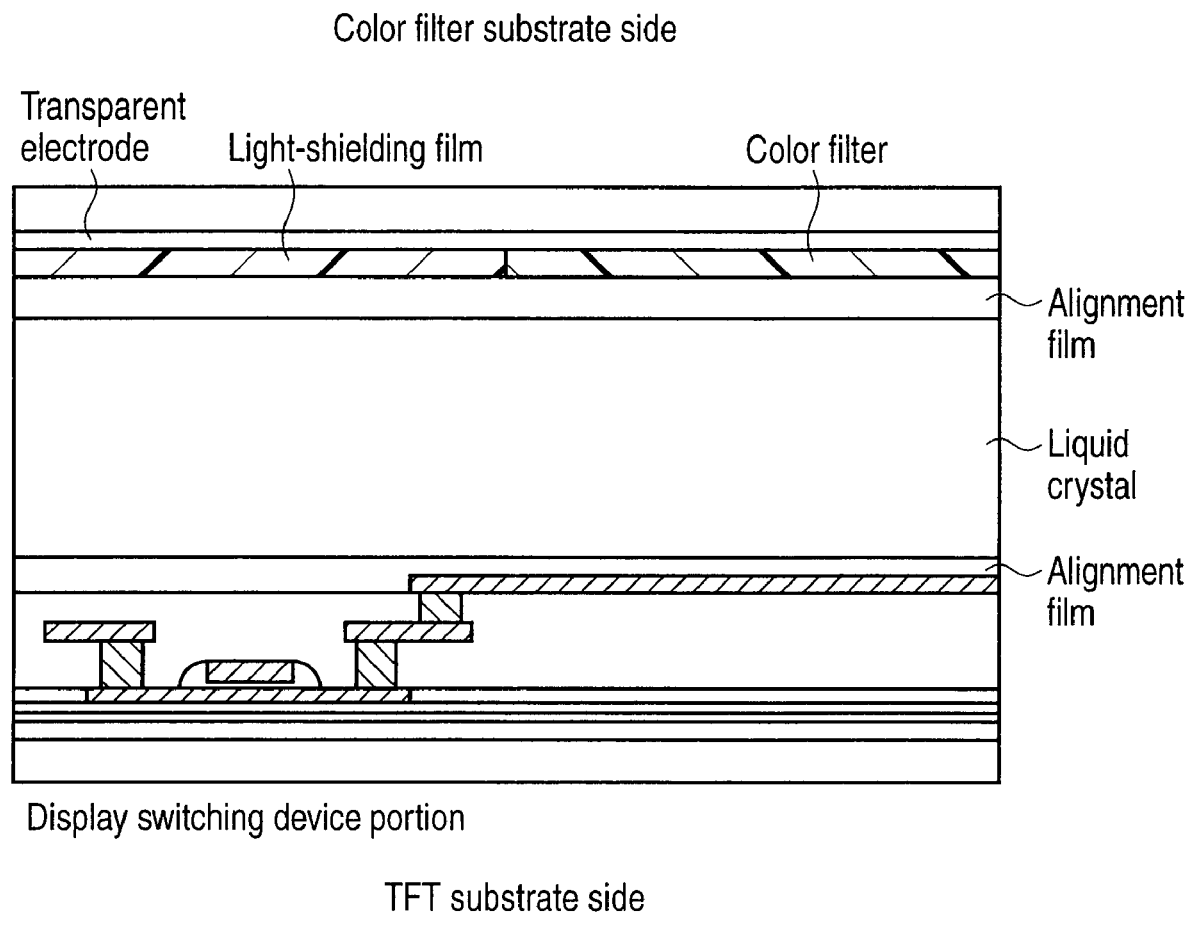
FIG. 7 is a view schematically illustrating the cross-sectional structure of a liquid crystal display device.
Figure 8:
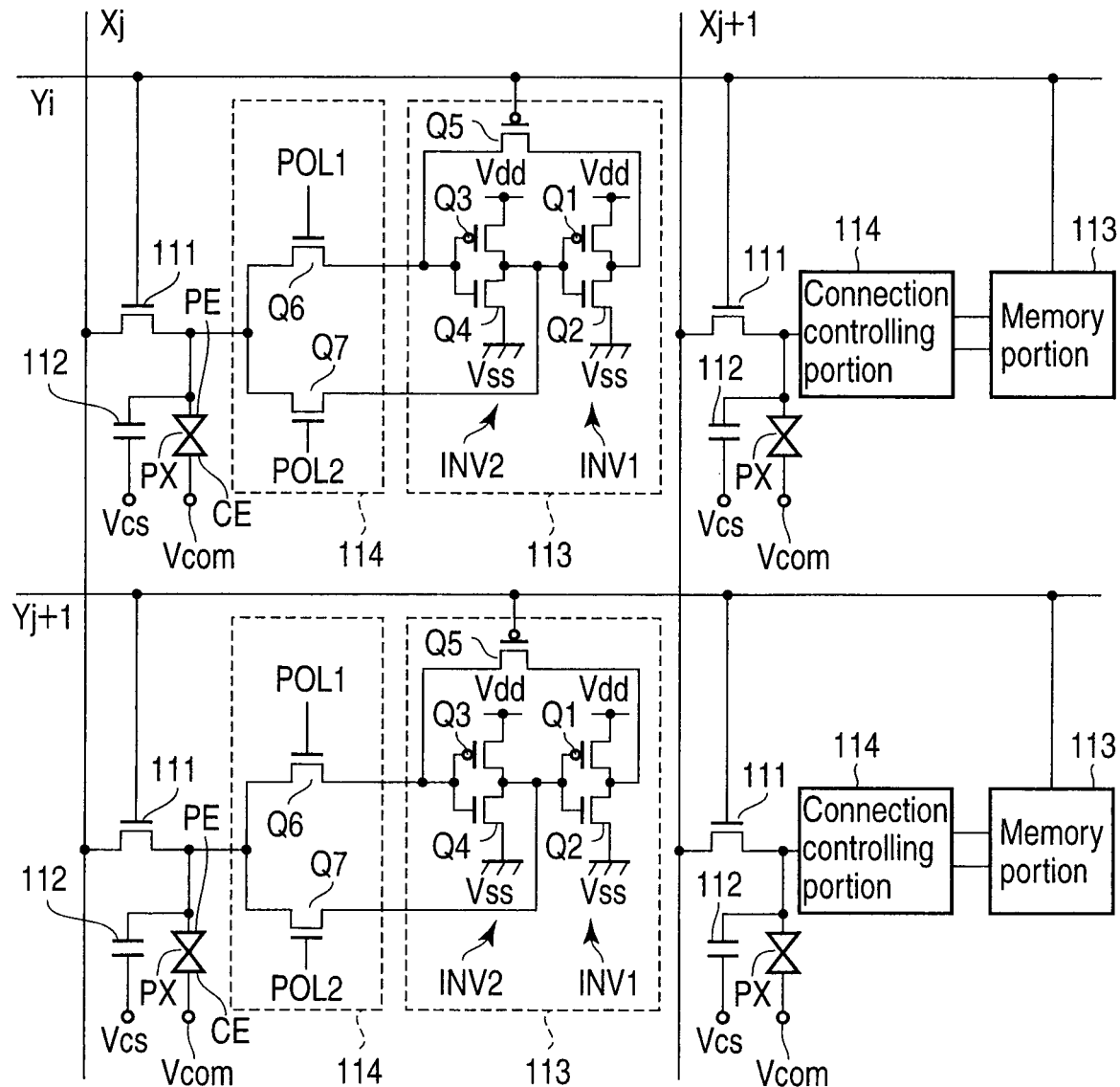
FIG. 8 is a diagram illustrating an equivalent circuit of the periphery of the display pixel shown in FIG. 6.

FIG. 6 shows a schematic circuit structure of this liquid crystal display device. FIG. 7 shows a schematic cross-sectional view of this liquid crystal display device. FIG. 8 shows an equivalent circuit of the periphery of the display pixel.

This liquid crystal display device is equipped with a liquid crystal display panel 100 and with a liquid crystal controller 102 for controlling the liquid crystal display panel 100. This liquid crystal display panel 100 is configured such that the liquid crystal layer LQ thereof is sustained between an array substrate AR and a counter substrate CT. The liquid crystal controller 102 is disposed on a driving circuit substrate which is disposed independent from the liquid crystal display panel 100.

The array substrate AR is equipped with a plurality of pixel electrodes PE which are arranged in a form of matrix in the display region DS on a glass substrate; with a plurality of scanning lines (Y1-Ym) which are formed along the lines of the plurality of pixel electrodes PE; with a plurality of signal lines (X1-Xn) which are formed along the columns of the plurality of pixel electrodes PE; pixel switching devices 111 respectively disposed close to each of the intersected portions between the signal lines X1-Xn and the scanning lines Y1-Ym and designed to take up picture signals Vpix from corresponding signal line X in response to the scanning signals transmitted from each of corresponding scanning lines Y and to transmit these signals to a corresponding pixel electrode PE; a scanning line driving circuit 103 for driving the scanning lines Y1-Ym; and a signal line driving circuit 104 for driving the signal lines X1-Xn. Each of the pixel switching devices 111 may be constituted, for example, by a N-channel polycrystalline silicon thin film transistor that can be manufactured as described in the above-described examples. In the same manner as in the case of the thin film transistor of the pixel switching devices 111, the scanning line driving circuit 103 and the signal line driving circuit 104 may be integrally constructed by a plurality of polycrystalline silicon thin film transistors which are designed to be formed on the array substrate AR as described in the above-described examples. The counter substrate CT is disposed to face a plurality of the pixel electrodes PE and comprises a single counter electrode CE to be set to a common potential Vcom and a color filter (not shown).

The liquid crystal controller 102 is designed to receive picture signals and synchronizing signals to be supplied from an external device for example and to generate, at an ordinary display mode, pixel picture signals Vpix, vertical scanning control signals YCT and horizontal scanning control signals XCT. The vertical scanning control signals YCT include, for example, a vertical start pulse, a vertical clock signal, an output enable signal ENAB, etc. which are designed to be supplied to the scanning line driving circuit 103. The horizontal scanning control signals XCT include, for example, a horizontal start pulse, a horizontal clock signal, a polarity inversion signal, etc. which are designed to be supplied to the signal line driving circuit 104 together with the picture signals Vpix.

The scanning line driving circuit 103 includes a shift resistor and is designed to be controlled by the vertical scanning control signals YCT so as to successively supply scanning signals for conducting the pixel switching devices 111 to the scanning lines Y1-Ym at each vertical scanning (flame) period. The shift resistor is designed to shift, synchronously with the vertical clock signal, the vertical start pulse to be supplied at each vertical scanning period, thereby enabling to select one scanning line from a plurality of the scanning lines Y1-Ym and to output a scanning signal to the selected scanning line in reference to the output enable signal ENAB. In order to allow the output of scanning signal during the effective scanning period out of the vertical scanning (flame) period, the output enable signal ENAB is maintained at a high level and, at the same time, in order to prohibit the output of scanning signal during the vertical blanking period excluding the effective scanning period from the vertical scanning period, the output enable signal ENAB is maintained at a low level.

The signal line driving circuit 104 comprises a shift resistor and a sampling output circuit and is enabled to execute the series-parallel conversion of the picture signal to be input during one horizontal scanning period (1H) wherein each of the scanning lines Y is driven by the scanning signal and hence the signal line driving circuit 104 is designed to be controlled by the horizontal scanning control signal XCT so as to feed the analog picture signal Vpix that has been sampled as a pixel display signal to each of the signal lines X1-Xn.

Incidentally, the counter electrode CE is set to a common potential Vcom as shown in FIG. 8. This common potential Vcom is designed to be inverted in level from 0V to 5V or from 5V to 0V every horizontal scanning period (H) in the ordinary display mode and also designed to be inverted in level from 0V to 5V or from 5V to 0V every flame period (F) in the static picture display mode. Further, in the ordinary display mode, the common potential Vcom may be inverted in level every 2H or every flame period (F), for example, instead of executing the level inversion of the common potential Vcom every horizontal scanning period (H) as described in this embodiment.

The polarity inversion signal is fed, synchronously with the level inversion of this common potential Vcom, to the signal line driving circuit 104. In this signal line driving circuit 104, the picture signal Vpix having an amplitude width ranging from 0V to 5V in the ordinary display mode is output after executing the level inversion in response to the polarity inversion signal so as to take the opposite polarity to the common potential Vcom in the ordinary display mode, whereas in the static picture display mode, a picture signal restricted in gradation for a stationary picture is output and then the operation thereof is suspended.

The liquid crystal layer LQ of this liquid crystal display panel 100 is formed of normally white capable of executing a black display through the application of a picture signal Vpix of 5V, for example, to the pixel electrode PE relative to a common potential Vcom of 0V which is set to the counter electrode CE. In this case, an H-common reversion driving is adopted wherein, as described above, the potential relationship between the picture signal Vpix and the common potential Vcom is alternately reversed every horizontal scanning period (H) in the ordinary display mode, and a flame reversion driving is adopted wherein the potential relationship is alternately reversed every flame in the static picture display mode.

Display face is constituted by a plurality of display pixels PX. Each of the display pixels PX comprises a pixel electrode PE, a counter electrode CE and a liquid crystal material of the liquid crystal layer LQ which is sandwiched between the PE and the CE. Further, a plurality of static memory portions 113 and a plurality of connection controlling portions 114 are respectively arranged relative to the plurality of the display pixels PX.

As shown in FIG. 8, the pixel electrode PE are connected to the pixel switching devices 111 which is designed to selectively pick up the picture signal Vpix on the signal lines X and are also capacitively coupled to the auxiliary capacity lines having an electric potential Vcs which is set equal to the common potential Vcom of the counter electrode CE. The pixel electrode PE and the counter electrode CE are designed to constitute a liquid crystal capacity through a liquid crystal material, whereas the pixel electrode PE and the auxiliary capacity lines are designed to constitute, without the intervention of the liquid crystal material, an auxiliary capacity 112 which is parallel with the liquid crystal capacity.

The pixel switching devices 111 are designed to transmit the picture signal Vpix on the signal lines X to the display pixels PX as the pixel switching devices 111 are driven by a scanning signal transmitted from the scanning lines Y. The auxiliary capacity 112 is provided with a sufficiently large capacity value as compared with the liquid crystal capacity and is designed to execute the charging/discharging by way of the picture signal Vpix which has been transmitted to the display pixels PX. When the picture signal Vpix is retained in the auxiliary capacity 112 by this charging/discharging, this picture signal Vpix acts to compensate the fluctuation of electric potential that is kept in the liquid crystal capacity as the pixel switching devices 111 are turned into non-conductive, thereby making it possible to retain the potential difference between the pixel electrode PE and the counter electrode CE.

Further, each of the static memory portions 113 is provide with P-channel polycrystalline silicon thin film transistors Q1, Q3 and Q5 and N-channel polycrystalline silicon thin film transistors Q2 and Q4, which can be formed as described in the aforementioned examples, and hence each of the static memory portions 113 is designed to keep the picture signal Vpix that has been transmitted to the display pixels PX from the pixel switching devices 111. Each of the connection controlling portions 114 is provide with N-channel polycrystalline silicon thin film transistors Q6 and Q7 and is designed not only to control the electric connection between the display pixels PX and the static memory portions 113 but also to constitute a polarity controlling circuit for controlling the output polarity of the picture signal kept in the static memory portions 113.

The thin film transistors Q1 and Q2 are configured so as to constitute a first inverter circuit INV1 which can be actuated by the power source voltage between a power source terminal Vdd (=5V) and a power source terminal Vss (=0V), whereas the thin film transistors Q3 and Q4 are configured so as to constitute a second inverter circuit INV2 which can be actuated by the power source voltage between the power source terminals Vdd and Vss. The output terminal of the first inverter circuit INV1 is connected, via the thin film transistors Q5 which can be controlled by way of the scanning lines Y, with the input terminal of the second inverter circuit INV2. The output terminal of the second inverter circuit INV2 is connected with the input terminal of the first inverter circuit INV1. The thin film transistors Q5 is designed such that it becomes non-conductive during a flame period wherein the pixel switching devices 111 are made conductive due to the rise of scanning signal from the scanning lines Y and that it becomes conductive during the next flame period. Because of this, the thin film transistors Q5 can be maintained in a non-conductive state until the pixel switching devices 111 is at least enabled to pick up the picture signal Vpix.

In the static picture display mode, the thin film transistors Q6 and Q7 will be controlled by the polarity control signals POL1 and POL2 which will be alternately set to a high level every flame period. The thin film transistor Q6 is connected with an intermediate portion between the pixel electrode PE and the output terminal of the first inverter circuit INV1 through the input terminal of the second inverter circuit INV2 and the thin film transistor Q5. The thin film transistor Q7 is connected with an intermediate portion between the pixel electrode PE and the input terminal of the first inverter circuit INV1 and also connected with an intermediate portion between the pixel electrode PE and the output terminal of the second inverter circuit INV2.

This liquid crystal display device is formed of a driving circuit-integrated body wherein the scanning line driving circuit 103, the signal line driving circuit 104, the static memory portions 113 and the connection controlling portions 114 are disposed on the same array substrate AR as that of the pixel switching devices 111. Herein, the scanning line driving circuit 103, the signal line driving circuit 104, the static memory portions 113 and the connection controlling portions 114 are collectively formed according to the process explained in the aforementioned examples. Therefore, it is possible to improve not only the performance but also the productivity of the liquid crystal display device. Further, since the static memory portions 113 are installed, it is possible to secure the function of retaining the picture signals supplied to the display pixel PX. Since the picture signals can be fed from the static memory portions 113 to the display pixel PX in the static picture display mode, it is possible to suspend the scanning line driving circuit 103 and the signal line driving circuit 104 while keeping this state, thereby making it possible to save entirely the power consumption of the display device.

What is claimed is:

1. A method of manufacturing a thin-film semiconductor device, which comprises:
    forming an amorphous semiconductor layer on a transparent insulating substrate;
    forming a crystallized region in the amorphous semiconductor layer;
    forming a gate insulating film and a gate electrode on the crystallized region;
    implanting an impurity at low concentration into an expected source region and an expected drain region of the crystallized region respectively neighboring to opposite sides of the gate electrode, the implanting being performed using the gate electrode as a mask;
    forming an insulating film on a surface of the resultant structure;
    etching back the insulating film until the crystallized region is exposed to thereby form a sidewall spacer on a sidewall of the gate electrode;
    forming an amorphous semiconductor layer for forming a stacked source layer and a stacked drain layer on a surface of the resultant structure;
    implanting an impurity at high concentration into the crystallized region and the amorphous semiconductor layer with the gate electrode and the sidewall spacer being used as a mask to thereby form a source diffusion region and a drain diffusion region in the crystallized region;
    subjecting the amorphous semiconductor layer to heat treatment, thereby not only activating the impurity implanted in the crystallized region and the amorphous semiconductor layer but also restoring crystallinity of only a portion of the amorphous semiconductor layer which is formed on the crystallized region to thereby turn said portion into a polycrystalline semiconductor layer; and
    subjecting the resultant surface to selective etching to thereby leave only the polycrystalline semiconductor layer which is deposited on the crystallized region and to remove the amorphous semiconductor layer formed on other regions, thereby forming, in a self-aligned manner, a stacked source diffusion layer consisting of polycrystalline semiconductor on the source diffusion layer and a stacked drain diffusion layer consisting of polycrystalline semiconductor on the drain diffusion layer.

2. The method according to claim 1, which further comprises pre-amorphizing a surface layer of the crystallized region by implanting Si or Ge into the crystallized region prior to implanting an impurity at low concentration into an expected source region and an expected drain region, which are located in the crystallized regions respectively neighboring to the opposite sides of the gate electrode.

3. The method according to claim 1, wherein the crystallized region is formed in the amorphous semiconductor layer by irradiation of laser beam to the amorphous semiconductor layer, thereby fusing and solidifying the amorphous semiconductor layer.

4. The method according to claim 1, wherein the heat treatment is performed by a method selected from the group consisting of furnace annealing, rapid thermal annealing, flash lamp annealing and laser annealing.

5. The method according to claim 1, wherein forming of a sidewall spacer on the sidewall of the gate electrode by subjecting the insulating film to an etch-back process until the crystallized region is exposed is performed by making use of a high-density plasma etching apparatus.

6. A method of manufacturing a thin-film semiconductor device, which comprises:
forming an amorphous semiconductor layer on a transparent insulating substrate; forming a crystallized region in the amorphous semiconductor layer;
forming a gate insulating film and a gate electrode on the crystallized region;
implanting an impurity at low concentration into an expected source region and an expected drain region of the crystallized region respectively neighboring to opposite sides of the gate electrode, the implanting being performed using the gate electrode as a mask;
forming an insulating film on a surface of the resultant structure;
etching back the insulating film until the crystallized region is exposed to thereby form a sidewall spacer on a sidewall of the gate electrode;
forming an amorphous semiconductor layer for forming a stacked source layer and a stacked drain layer on a surface of the resultant structure;
subjecting the amorphous semiconductor layer to a first heat treatment, thereby restoring crystallinity of only a portion of the amorphous semiconductor layer which is formed on the crystallized region to thereby turn said portion into a polycrystalline semiconductor layer;
subjecting the resultant surface to selective etching to thereby leave only the polycrystalline semiconductor layer which is formed on the crystallized region and to remove the amorphous semiconductor layer deposited on other regions;
implanting an impurity at high concentration into the crystallized region and the polycrystalline semiconductor layer with the gate electrode and the sidewall spacer being used as a mask to thereby form a source diffusion region and a drain diffusion region in the crystallized region and in the polycrystalline semiconductor layer; and
subjecting the crystallized region and the polycrystalline semiconductor layer to a second heat treatment to thereby activate impurity implanted into the crystallized region and the polycrystalline semiconductor layer.

7. The method according to claim 6, which further comprises a first pre-amorphizing for pre-amorphizing a surface layer of the crystallized region by implanting Si or Ge into the polycrystalline semiconductor layer prior to implanting an impurity at high concentration into the crystallized regions and the polycrystalline semiconductor layer; and a second pre-amorphizing for amorphizing a surface layer of the polycrystalline semiconductor layer by the implantation of Si or Ge into the polycrystalline semiconductor layer which is left in the crystallized region due to the selective etching prior to implanting an impurity at high concentration into the crystallized regions and the polycrystalline semiconductor layer.

8. The method according to claim 6, wherein the crystallized region is formed in the amorphous semiconductor layer by irradiation of laser beam to the amorphous semiconductor layer, thereby fusing and solidifying the amorphous semiconductor layer.

9. The method according to claim 6, wherein the first and second heat treatments is performed by a method selected from the group consisting of furnace annealing, rapid thermal annealing, flash lamp annealing and laser annealing.

10. The method according to claim 6, wherein forming of a sidewall spacer on the sidewall of the gate electrode by etching back the insulating film until the crystallized region is exposed is performed by making use of a high-density plasma etching apparatus.

11. A method of manufacturing a thin-film semiconductor device, which comprises:
forming an amorphous semiconductor layer on a transparent insulating substrate;
forming a crystallized region in the amorphous semiconductor layer;
forming a gate insulating film and a gate electrode on the crystallized region;
implanting an impurity at low concentration into an expected source region and an expected drain region of the crystallized regions respectively neighboring to opposite sides of the gate electrode, the implanting being performed using the gate electrode as a mask;
forming an insulating film on a surface of the resultant structure;
etching back the insulating film until the crystallized region is exposed to thereby form a sidewall spacer on a sidewall of the gate electrode;
forming an amorphous semiconductor layer for forming a stacked source layer and a stacked drain layer on a surface of the resultant structure;
implanting an impurity at high concentration into the crystallized region and the amorphous semiconductor layer with the gate electrode and the sidewall spacer being used as a mask to thereby form a source diffusion region and a drain diffusion region in the crystallized region;
subjecting the amorphous semiconductor layer to a first heat treatment, thereby not only activating impurity implanted in the crystallized region and the amorphous semiconductor layer but also restoring the crystallinity of only a portion of the amorphous semiconductor layer which is formed on the crystallized region to thereby turn said portion into a polycrystalline semiconductor layer;
subjecting the resultant surface to selective etching to thereby leave only the polycrystalline semiconductor layer which is formed on the crystallized region and to remove the amorphous semiconductor layer formed on other regions, thereby forming, in a self-aligned manner, a stacked source diffusion layer formed of polycrystalline semiconductor on the source diffusion layer and a stacked drain diffusion layer formed of polycrystalline semiconductor on the drain diffusion layer;
forming a high-melting point metal layer on a surface of resultant structure;
subjecting a resultant surface to a second heat treatment to thereby form a silicide film at an interface between the stacked source diffusion layer and the high-melting point metal layer and at an interface between the stacked drain diffusion layer and the high-melting point metal layer;

removing unreacted high-melting point metal layer, leaving the silicide film on the stacked drain diffusion layer and on the stacked drain diffusion layer; and subjecting a resultant surface to a third heat treatment to thereby accomplish the silicidation and form a source diffusion region including the source diffusion region, the stacked source diffusion layer and the silicide film, and a drain diffusion region including the drain diffusion region, the stacked source diffusion layer and the silicide film on opposite sides of the gate electrode.

12. The method according to claim 11, wherein the crystallized region is formed in the amorphous semiconductor layer by the irradiation of laser beam to the amorphous semiconductor layer, thereby fusing and solidifying the amorphous semiconductor layer.

13. The method according to claim 11, wherein the first, second and third heat treatments is performed by a method selected from the group consisting of furnace annealing, rapid thermal annealing, flash lamp annealing and laser annealing.

14. The method according to claim 11, wherein forming of the sidewall spacer on the sidewall of the gate electrode by etching back the insulating film until the crystallized region is exposed is performed by making use of a high-density plasma etching apparatus.

15. The method according to claim 11, which further comprises a first pre-amorphizing for amorphizing a surface layer of the crystallized region by implanting Si or Ge into the crystallized region prior to implanting an impurity at low concentration into an expected source region and an expected drain region of the crystallized regions respectively neighboring to the opposite sides of the gate electrode.

16. The method according to claim 15, wherein implanting an impurity at high concentration is performed subsequent to the first heat treatment.

17. The method according to claim 15, wherein implanting an impurity at high concentration is performed subsequent to the second heat treatment.

18. The method according to claim 16, which further comprises a second pre-amorphizing for amorphizing a surface layer of the polycrystalline semiconductor layer by the implantation of Si or Ge into the polycrystalline semiconductor layer which is left in the crystallized region due to the selective etching.

19. The method according to claim 15, wherein the high-melting point metal is one metal selected from the group consisting of Ni, Ti, Co, Mo and W.

* * * * *